United States Patent
Limberg

(10) Patent No.: US 6,950,481 B2
(45) Date of Patent: Sep. 27, 2005

(54) DIGITAL TELEVISION RECEIVER CONVERTING VESTIGIAL-SIDEBAND SIGNALS TO DOUBLE-SIDEBAND AM SIGNALS BEFORE

(75) Inventor: Allen LeRoy Limberg, Vienna, VA (US)

(73) Assignee: Samsung Electronics Co., Ltd., Kyungki-do (KR)

(*) Notice: Subject to any disclaimer, the term of this patent is extended or adjusted under 35 U.S.C. 154(b) by 4 days.

(21) Appl. No.: 10/460,416

(22) Filed: Jun. 13, 2003

(65) Prior Publication Data

US 2003/0224725 A1 Dec. 4, 2003

Related U.S. Application Data

(62) Division of application No. 09/440,469, filed on Nov. 15, 1999, now Pat. No. 6,687,313.
(60) Provisional application No. 60/132,874, filed on May 5, 1999, and provisional application No. 60/138,108, filed on Jun. 7, 1999.

(51) Int. Cl.[7] .............................................. H03D 1/24
(52) U.S. Cl. ....................... 375/321; 329/356; 329/357; 455/204
(58) Field of Search ............................... 375/268, 270, 375/277, 320, 321; 348/441, 725; 455/47, 204; 329/356, 357

(56) References Cited

U.S. PATENT DOCUMENTS

| | | | | |
|---|---|---|---|---|
| 2,583,573 A | * | 1/1952 | Jaynes | 342/104 |
| 2,987,617 A | * | 6/1961 | Loughlin | 455/204 |
| 5,479,449 A | * | 12/1995 | Patel et al. | 375/316 |
| 5,805,242 A | | 9/1998 | Strolle et al. | |
| 6,421,403 B1 | | 7/2002 | Limberg | |

* cited by examiner

*Primary Examiner*—Khai Tran
*Assistant Examiner*—David B. Lugo
(74) *Attorney, Agent, or Firm*—Sughrue Mion, PLLC

(57) ABSTRACT

A vestigial-sideband (VSB) signal is converted to a double-sideband amplitude-modulation signal having information that is subsequently detected in the double-sideband amplitude-modulation signal. A method for performing the conversion includes mixing the VSB signal with a first beat frequency different from a carrier frequency of the VSB signal, the first beat frequency being of such value as to generate a first mixing result that is translated in frequency to have a carrier at an offset frequency; mixing the VSB signal with a second beat frequency different from the carrier frequency of the VSB signal and from the first beat frequency, the second beat frequency being of such value as to generate a second mixing result that is translated in frequency to have a earner at the offset frequency; and combining the first and second mixing results to form the double-sideband amplitude-modulation signal with a carrier frequency at the offset frequency.

9 Claims, 12 Drawing Sheets

DIGITAL TELEVISION RECEIVER CONVERTING VESTIGIAL-SIDEBAND SIGNALS TO DOUBLE-SIDEBAND AM SIGNALS BEFORE

This is a divisional of application Ser. No. 09/440,469 filed Nov. 15, 1999, now U.S. Pat. No. 6,687,313, which claims benefit of Provisional Application No. 60/132,874 filed May 5, 1999, and Provisional Application No. 60/138,108 filed Jun. 7, 1999.

The invention relates to radio receivers for receiving vestigial-sideband signals, which radio receivers are used in digital television sets, for example.

BACKGROUND OF THE INVENTION

Digital communications frequently employ vestigial-sideband (VSB) signals in which the passband response is reduced at carrier frequency. Excluding from consideration a pilot carrier added to the VSB suppressed-carrier-AM digital television (DTV) signals transmitted in accordance with the 1995 standard for digital television broadcasting established by the Advanced Television Standards Committee (ATSC), the radio-frequency spectrum of the VSB DTV signals exhibits 3 dB roll-off at a carrier frequency 310 khz from the lower frequency bound of the six-megahertz-wide television channels. A problem with VSB signals with roll-off through carrier frequency is that the asymmetry of the modulation sidebands introduces jitter into carrier tracking that is done using variants of the well-known Costas loop. In some digital communications systems the transmitter employs filtering to eliminate modulation sideband energy in the vicinity of the carrier frequency. The ATSC standard does not specifically provide for eliminating modulation sideband energy near the carrier frequency. Instead, a pilot carrier of substantial strength is inserted into the VSB suppressed-carrier-AM DTV signals to reduce the carrier jitter caused by modulation sideband energy near the carrier frequency.

The transient response of synchronous demodulation of VSB signals is notoriously dependent on the roll-off of frequency response through the carrier region in the final I-F signal being synchronously demodulated.

A type of radio receiver design that is employed in digital television sets employs a six-megahertz-wide final intermediate-frequency signal that is offset from zero-frequency by no more than a few megaHertz. This VSB final I-F signal is digitized, converted to a complex digital final I-F signal, and then synchrodyned to baseband using a digital complex multiplier. The digital complex multiplier multiplies the complex digital final I-F signal by a complex digital carrier to recover in-phase and quadrature-phase baseband results of the synchrodyne carried out in the digital regime. The in-phase baseband results are used as symbol code input by the symbol decoder of the DTV receiver. The quadrature-phase baseband results are lowpass filtered, and the lowpass filter response is used to control the frequency and phase of local oscillations used in the down conversion to final I-F signal, implementing a procedure known as bandpass tracking. This type of receiver is more fully described in U.S. Pat. No. 5,479,449 issued 26 Dec. 1996 to C. B. Patel and A. L. R. Limberg, entitled "DIGITAL VSB DETECTOR WITH BANDPASS PHASE TRACKER, AS FOR INCLUSION IN AN HDTV RECEIVER", and assigned to Samsung Electronics Co., Ltd. U.S. Pat. No. 5,479,449 describes the carrier of the final I-F signal being below an upper sideband that is synchronously detected in the digital regime to recover baseband symbol code. Such final I-F signal is the result of a downconversion in which a very-high-frequency (VHF) intermediate-frequency signal is heterodyned with local oscillations of a VHF frequency below the VHF I-F signal frequency band. A final I-F signal with the carrier of above a lower sideband is the result of a downconversion in which a very-high-frequency (VHF) intermediate-frequency signal is heterodyned with local oscillations of a VHF frequency above the VHF I-F signal frequency band. This is described in U.S. Pat. No. 5,659,372 issued 19 Aug. 1997 to C. B. Patel and A. L. R. Limberg, entitled "DIGITAL TV DETECTOR RESPONDING TO FINAL-IF SIGNAL WITH VESTIGIAL SIDEBAND BELOW FULL SIDEBAND IN FREQUENCY", and assigned to Samsung Electronics Co., Ltd. U.S. Pat. No. 5,659,372 describes the final I-F signal with the carrier above a lower sideband being synchrodyned to baseband in the digital regime to recover baseband symbol code.

SUMMARY OF THE INVENTION

A VSB signal is downconverted to a double-sideband amplitude-modulation final intermediate-frequency signal that is subsequently detected to generate a baseband demodulation result. The carrier of the final intermediate-frequency signal has a carrier offset from zero-frequency, which carrier offset exceeds the highest modulating frequency of the VSB signal and is adjusted to a prescribed carrier offset value.

The downconversion to the DSB AM I-F signal is accomplished in certain embodiments of the invention by heterodyning the VSB signal with a heterodyning signal essentially consisting of first and second frequency components. The first frequency component of the heterodyning signal is lower in frequency than the carrier of the VSB signal by an amount equal to the carrier offset value prescribed for the final I-F signal. The second frequency component of the heterodyning signal is higher in frequency than the carrier of the VSB signal by an amount equal to the carrier offset value prescribed for the final I-F signal. In preferred ones of these embodiments of the invention, the heterodyning signal is generated by a balanced modulator providing suppressed-carrier amplitude-modulation of oscillations supplied from a controlled local oscillator. The modulation of these local oscillations by the balanced modulator is in response to a modulating signal of a frequency equal to the carrier offset value prescribed for the final I-F signal. There is automatic frequency and phase control (AFPC) of the local oscillations that the controlled local oscillator supplies. The AFPC is responsive to the departure of the carrier of the final I-F signal from its prescribed value of offset from zero frequency. The DSB AM final I-F signal is demodulated using an in-phase synchronous detector for recovering baseband symbol code and a quadrature-phase synchronous detector for developing AFPC signal for the controlled local oscillator.

The downconversion to the DSB AM I-F signal is accomplished in other embodiments of the invention by downconverting the VSB signal conventionally, to generate a VSB signal including a carrier frequency offset from zero frequency by an amount greater than the bandwidth of the VSB signal. The downconverted VSB signal is digitized. Then, the digitized downconverted VSB signal is multiplied by a second harmonic of the carrier to generate another VSB signal, and the two digitized VSB signals are added together to complete generation of the DSB AM signal in the digital regime.

DETAILED DESCRIPTION

Figure 1:
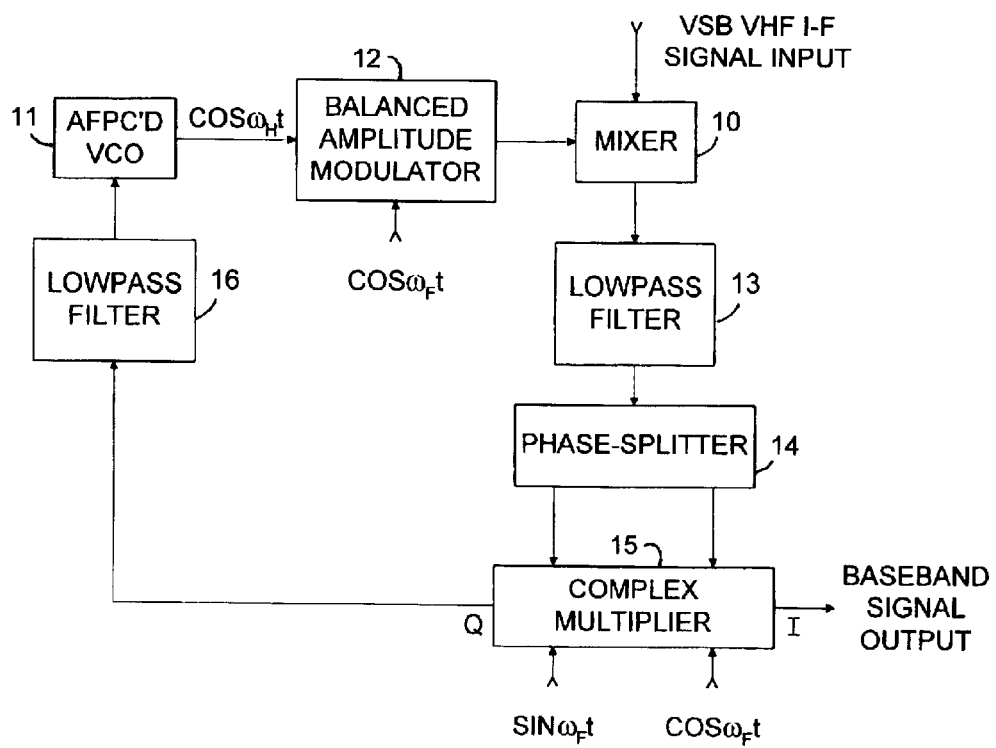
FIG. 1 is a conceptual block schematic diagram of apparatus for demodulating in accordance with the method of the invention a vestigial-sideband amplitude-modulation signal, which apparatus includes a phase-splitter to implement demodulation using a digital complex multiplier.

FIG. 1 shows a portion of a VSB radio signal receiver following the customary gain-controlled VHF intermediate-frequency amplifier chain, which amplifier chain supplies VSB amplified VHF I-F signal to a mixer 10 for downconversion to a final I-F signal. A voltage-controlled oscillator (VCO) 11 is designed for operation as a controlled local oscillator with automatic frequency and phase control of its oscillations at a very high frequency $f_H$. These oscillations are supplied to a balanced amplitude-modulator 12 for modulation in accordance with a prescribed final I-F carrier frequency $f_F$. The balanced amplitude-modulator 12 supplies the mixer 10 a heterodyning signal essentially consisting of a first component of frequency $(f_H-f_F)$ and a second component of frequency $(f_H+f_F)$. The mixer 10 multiplies the VSB amplified VHF I-F signal by the heterodyning signal supplied by the amplitude-modulator 12. The resulting product output signal from the mixer 10 is lowpass filtered by a lowpass filter 13 to separate a DSB AM final I-F signal from its image in the VHF band.

The DSB AM final I-F signal is supplied to a phase-splitter 14 that converts the real signal to a complex signal having real and imaginary components supplied to a complex multiplier 15 as a complex multiplicand signal. The complex multiplier 15 synchrodynes this complex multiplicand signal with a final I-F carrier signal supplied to the complex multiplier 15 as a complex multiplier signal. The resulting complex product supplied from the complex multiplier 15 has an in-phase (I) baseband component, which is a demodulation result descriptive of the modulating signal used in generating the transmitted VSB signal currently being received. The complex product also has a quadrature-phase (Q) baseband component, which is supplied to a lowpass filter 16. The response of the lowpass filter 16 is applied to the VCO 11 as an automatic frequency and phase control (AFPC) signal.

The response of the complex multiplier 15 to a component $\cos \omega_V t$ of the VSB amplified VHF I-F signal will be calculated using the three well-known trigonometric identities that follow.

$$\cos \theta \cos \phi = 0.5 \cos (\theta-\phi) + 0.5 \cos (\theta+\phi) \quad (1)$$

$$\sin \theta \sin \phi = 0.5 \cos (\theta-\phi) - 0.5 \cos (\theta+\phi) \quad (2)$$

$$\sin \theta \cos \phi = 0.5 \sin (\theta-\phi) + 0.5 \sin (\theta+\phi) \quad (3)$$

The local oscillations that the oscillator 11 supplies to the balanced amplitude-modulator 12 will be assumed to be of the form $\cos \omega_H t$, and the modulating signal supplied to the balanced amplitude-modulator 12 will be assumed to be of the form $\cos \omega_F t$. In accordance with the identity (1), the response $R_{12}$ from the balanced amplitude-modulator 12 is of the following form.

$$R_{12} = 0.5 \cos (\omega_H-\omega_F)t + 0.5 \cos (\omega_H+\omega_F)t \quad (4)$$

Further in accordance with the identity (1), the response $R_{10}$ from the mixer 10 is an ensemble of components each of the form in the following equation (5).

$$R_{10} = 0.25\cos(\omega_H - \omega_F - \omega_V)t + 0.25\cos(\omega_H - \omega_F + \omega_V)t + \quad (5)$$
$$0.25\cos(\omega_H + \omega_F - \omega_V)t + 0.25\cos(\omega_H + \omega_F + \omega_V)t$$

The lowpass filter 13 suppresses the high frequency terms in its response $R_{13}$ to the mixer 10 response $R_{10}$, which response $R_{13}$ is an ensemble of components each of the form in the following equation (6).

$$R_{13} = 0.25\cos(\omega_H - \omega_F - \omega_V)t + 0.25\cos(\omega_H + \omega_F - \omega_V)t \quad (6)$$

The phase-splitter 14 repeats the lowpass filter 13 response $R_{13}$ as its real response $Re_{14}$, which is an ensemble of components each of the form in the following equation (7), and generates its imaginary response $Im_{14}$, which is an ensemble of components each of the form in the following equation (8).

$$Re_{14} = 0.25\cos(\omega_H - \omega_F - \omega_V)t + 0.25\cos(\omega_H + \omega_F - \omega_V)t \quad (7)$$

$$Im_{14} = 0.25\sin(\omega_H - \omega_F - \omega_V)t + 0.25\sin(\omega_H + \omega_F - \omega_V)t \quad (8)$$

The in-phase response I of the complex multiplier 15 is an ensemble of frequency components, each defined by the following equations (9).

$$I = Re_{14}\cos\omega_F t + Im_{14}\sin\omega_F t \quad (9)$$
$$= 0.25\cos(\omega_H - \omega_F - \omega_V)t * \cos\omega_F t +$$
$$0.25\cos(\omega_H + \omega_F - \omega_V)t * \cos\omega_F t +$$
$$0.25\sin(\omega_H - \omega_F - \omega_V)t * \sin\omega_F t +$$
$$0.25\sin(\omega_H + \omega_F - \omega_V)t * \sin\omega_F t$$
$$= \cos(\omega_H - \omega_V)t$$

The quadrature-phase response Q of the complex multiplier 15 is an ensemble of frequency components, each defined by the following equations (10).

$$Q = Re_{14}\sin\omega_F t - Im_{14}\cos\omega_F t \quad (10)$$
$$= 0.25\cos(\omega_H - \omega_F - \omega_V)t * \sin\omega_F t +$$
$$0.25\cos(\omega_H + \omega_F - \omega_V)t * \sin\omega_F t -$$
$$0.25\sin(\omega_H - \omega_F - \omega_V)t * \cos\omega_F t -$$
$$0.25\sin(\omega_H + \omega_F - \omega_V)t * \cos\omega_F t$$
$$= \sin(\omega_H - \omega_V)t$$

The I and Q responses are the same as for the well-known Costas loop described in U.S. Pat. No. 3,101,448 issued 20 Aug. 1963 to J. P. Costas and titled "SYNCHRONOUS DETECTOR SYSTEM".

So, the design of the filter 16 in the AFPC loop controlling the VCO 11 can follow convention practice for Costas loops. As one skilled in the art and acquainted with the foregoing disclosure will appreciate, there are other circuit arrangements that use two separate local oscillators for generating the two tracking frequency terms 0.5 COS $(\omega_H-\omega_F)$t and 0.5 cos $(\omega_H+\omega_F)$t, rather than the single local oscillator 11 and the balanced amplitude-modulator 12. However, tracking the oscillators with separate AFPC loops is considerably more difficult to implement successfully in practice.

Figure 2:
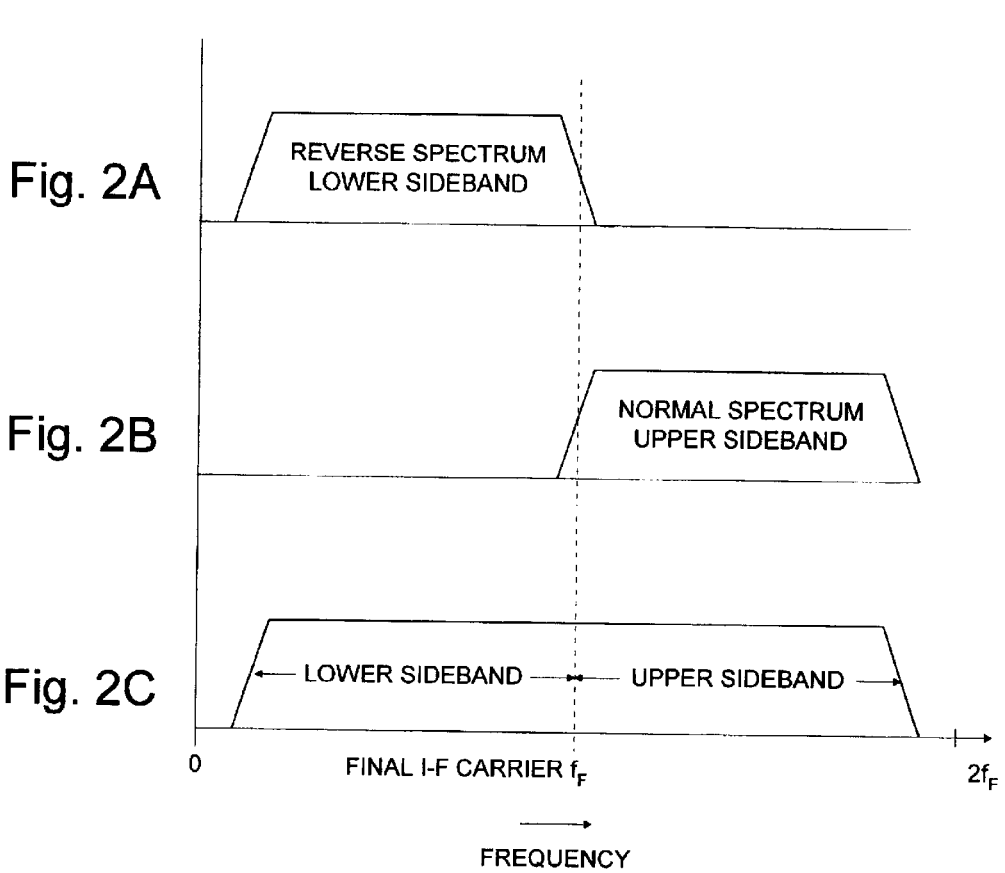
FIG. 2A is a diagram of a reverse-frequency-spectrum lower-vestigial-sideband amplitude-modulation component of the final intermediate-frequency signal that obtains when demodulating in accordance with the invention, which reverse-frequency-spectrum component is plotted as an ordinate against the same frequency abscissa.
FIG. 2B is a diagram of normal-frequency-spectrum upper-vestigial-sideband amplitude-modulation component of the final intermediate-frequency signal that obtains when demodulating in accordance with the invention, which normal-frequency-spectrum component is plotted as another ordinate against the same frequency abscissa as the frequency-spectrum component of FIG. 2A.
FIG. 2C is a diagram of the frequency spectrum of the double-sideband amplitude-modulation final intermediate-frequency signal that obtains when demodulating in accordance with the invention, which complete DSB AM final I-F signal spectrum is plotted as yet another ordinate against the same frequency abscissa as the frequency-spectrum components of FIGS. 2A and 2B.

The matter that is considered further with reference to FIGS. 2A, 2B and 2C is how the VSB amplified VHF I-F signal supplied to the mixer 10 is converted to a DSB AM signal in the response $R_{13}$ of the lowpass filter 13 following the mixer 10. The VSB amplified VHF I-F signal usually exhibits a reverse-frequency-spectrum so the principal sideband is lower in frequency than the remnant, suppressed sideband close to the VHF I-F carrier. This reverse-frequency-spectrum VHF I-F signal obtains if there is a direct downconversion of the radio-frequency (R-F) VSB DTV signal by superheterodyne with a tuned oscillator of higher frequency, similar to what is done in commercial analog TV receivers. This reverse-frequency-spectrum VHF I-F signal also obtains in certain plural-conversion receivers. In a plural-conversion receiver of this type the R-F VSB DTV signal is first upconverted to an ultra-high-frequency intermediate frequency signal by superheterodyne with oscillations of higher frequency than its own that are supplied from a tuned oscillator. In this type of plural-conversion receiver, in order to downconvert the UHF I-F signal to the VHF I-F signal, the UHF I-F signal is subsequently heterodyned with oscillations of frequency lower than its own, which oscillations are supplied from a fixed-frequency oscillator.

FIG. 2A diagrams the reverse-frequency-spectrum, principally lower-sideband component of the final I-F signal that results from the reverse-spectrum VHF I-F signal heterodyning with the 0.5 cos $(\omega_H-\omega_F)$t component of the balanced amplitude-modulator 12 output signal $R_{12}$, which is lower in frequency than the VHF I-F signal. In this type of receiver the FIG. 2A reverse-frequency spectrum is the ensemble of 0.25 cos $(\omega_H-\omega_F-\omega_V)$t terms in the lowpass filter 13 response $R_{13}$ for all $\omega_V$ terms in the reverse-spectrum VHF I-F signal.

FIG. 2B diagrams the normal-frequency-spectrum, principally upper-sideband amplitude-modulation component of the final I-F signal that results from the reverse-spectrum VHF I-F signal heterodyning with the 0.5 cos $(\omega_H-\omega_F)$t component of the balanced amplitude-modulator 12 output signal $R_{12}$, which is higher in frequency than the VHF I-F signal. In this type of receiver the FIG. 2B normal-frequency spectrum is the ensemble of 0.25 cos $(\omega_H+\omega_F-\omega_V)$t terms in the lowpass filter 13 response $R_{13}$ for all $\omega_V$ terms in the reverse-spectrum VHF I-F signal.

FIG. 2C diagrams the frequency spectrum of the DSB AM final I-F signal that the lowpass filter 13 supplies as its response $R_{13}$. This spectrum is the sum of the subspectra that FIGS. 2A and 2B respespectively diagram. The angular frequency $\omega_F$ in radians/second is $2\pi$ times the final I-F signal carrier frequency $f_F$ in cycles per second that is shown on the abscissa axis for FIGS. 2A, 2B and 2C.

A normal-frequency-spectrum VHF I-F signal obtains in another type of plural-conversion receiver. In a plural-conversion receiver of this type, also, the R-F VSB DTV signal is first upconverted to an ultra-high-frequency intermediate frequency signal by superheterodyne with oscillations of higher frequency than its own that are supplied from a tuned oscillator. In this type of plural-conversion receiver, however, in order to downconvert the UHF I-F signal to the VHF I-F signal, the UHF I-F signal is subsequently heterodyned with oscillations of frequency higher than its own, which oscillations are supplied from a fixed-frequency oscillator. The normal-frequency-spectrum VHF I-F signal will heterodyne with the 0.5 cos $(\omega_H+\omega_F)$t component of the balanced amplitude-modulator 12 output signal $R_{12}$, which is higher in frequency than the VHF I-F signal, to generate the reverse-frequency-spectrum, principally lower-sideband component of the final I-F signal shown in FIG. 2A. In this type of receiver the FIG. 2A reverse-frequency spectrum is the ensemble of 0.25 cos $(\omega_H-\omega_F-\omega_V)$t terms in the lowpass filter 13 response $R_{13}$ for all $\omega_V$ terms in the normal-spectrum VHF I-F signal. The normal-frequency-spectrum VHF I-F signal will heterodyne with the 0.5 cos $(\omega_H-\omega_F)$t component of the balanced amplitude-modulator 12 output signal $R_{12}$, which is lower in frequency than the VHF I-F signal, to generate the normal-frequency-spectrum, principally upper-sideband component of the final I-F signal shown in FIG. 2B. In this type of receiver the FIG. 2B reverse-frequency spectrum is the ensemble of 0.25 cos $(\omega_H+\omega_V)$t terms in the lowpass filter 13 response $R_{13}$ for all $\omega_V$ terms in the normal-spectrum VHF I-F signal.

Figure 3:
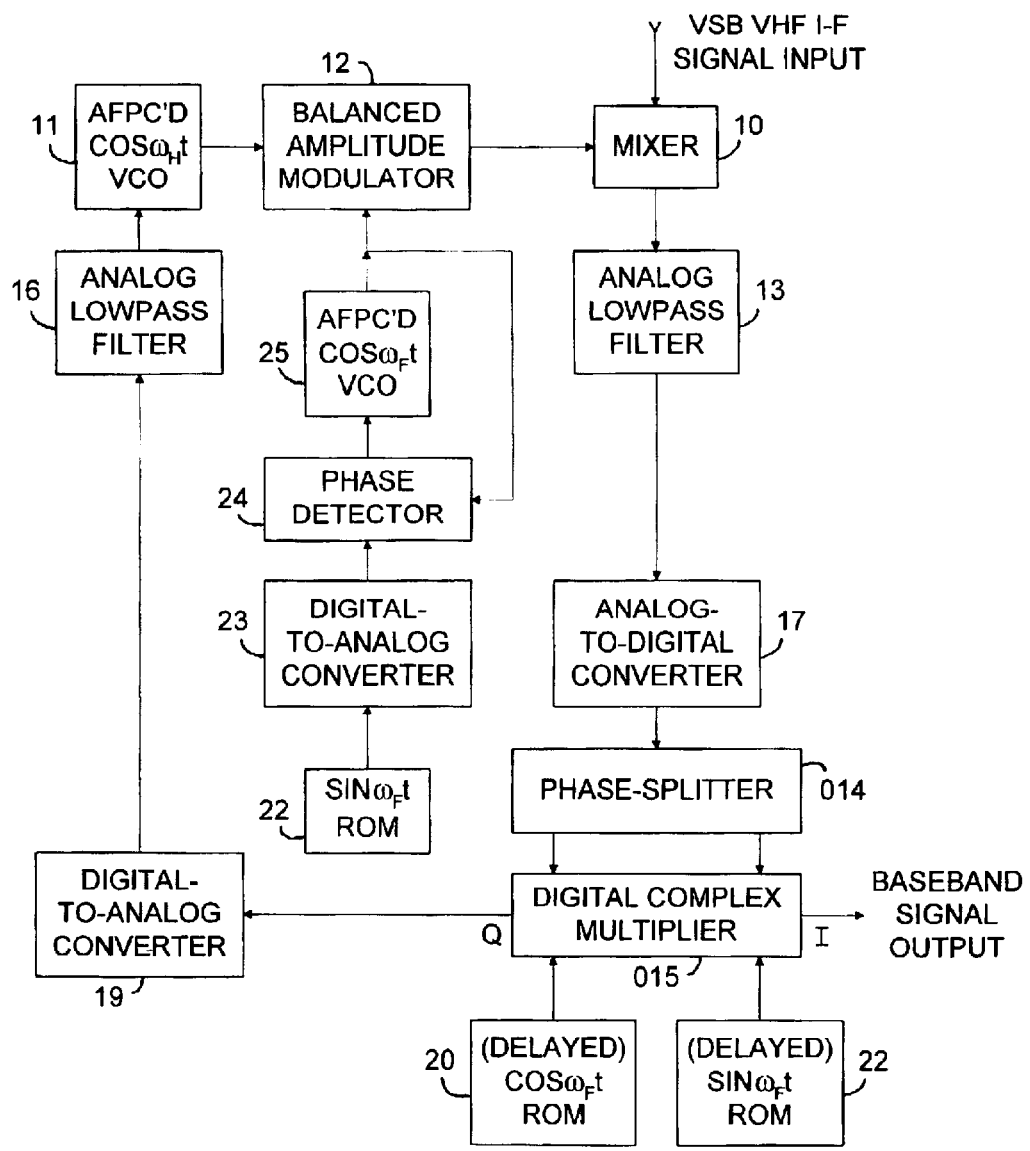
FIG. 3 is a block schematic diagram of apparatus for demodulating a vestigial-sideband amplitude-modulation signal, which apparatus embodies the invention.

FIG. 3 shows in more detail how the FIG. 1 concept is implemented when the demodulation is carried out in the digital regime, with the phase splitter 14 being a phase-splitter 014 of digital-filter type and the complex multiplier 15 being a digital complex multiplier 015. The lowpass filter 13 response $R_{13}$ is digitized by an analog-to-digital converter 17, and the resulting digitized DSB AM signal is applied as input signal to the phase-splitter 014. The in-phase response I supplied by the digital complex multiplier 015 as the real part of the complex product signal therefrom is a digital baseband signal, which is suited for application to subsequent portions of the receiver not shown in FIG. 3. These subsequent portions include baseband equalization and ghost cancellation filtering and subsequent symbol decoder apparatus. The quadrature-phase response Q supplied by the digital complex multiplier 015 as the imaginary part of the complex product signal therefrom is a digital baseband signal, which a digital-to-analog converter 19 converts to analog form to provide the input signal to the analog lowpass filter 16 that supplies AFPC signal to the VCO 11.

In the FIG. 3 apparatus variously phased digital carrier waves of $\omega_F$ radian/second frequency are generated from read-only memories 20, 21 and 22. Sampling in the FIG. 3 apparatus is synchronized to a rational multiple of symbol rate, which is most expeditiously implemented as follows, using elements not shown in FIG. 3. An envelope detector for the amplified VSB I-F signal is used to develop an envelope detector response that contains frequency components subharmonic to the symbol rate of the VSB DTV signal. The component at half symbol rate is selected by a narrowband bandpass filter and is rectified or doubled to recover symbol frequency against which a sample clock oscillator is synchronized by an automatic frequency and phase control loop. A sample counter counts average-axis-crossings of the oscillations from the sample clock oscillator and addressing for the ROMs 20, 21 and 22 is derived from the sample count or some portion thereof.

The ROM 20 stores a look-up table of sin $\omega_F$t values. The digital samples descriptive of the sin $\omega_F$t system function are supplied to a digital-to-analog converter 23 that responds with analog sin $\omega_F$t signal supplied to a phase detector 24. The phase detector 24 compares this analog sin $\omega_F$t signal with oscillations from a voltage-controlled oscillator 25 to generate an automatic frequency and phase control signal for the VCO 25. This AFPC signal locks the VCO 25 oscillations in quadrature phase with the analog sin $\omega_F$t input signal supplied to the phase detector 24. Consequently, the VCO 25 supplies cos $\omega_F$t oscillations, which are applied to the balanced amplitude-modulator 12 as modulating signal.

With reasonable care in the design of the VCO 25 there is very little harmonic distortion accompanying these cos $\omega_F$t oscillations. Alternatively, a cos $\omega_F$t system function could be drawn from ROM and converted to an analog cos $\omega_F$t signal to be supplied to the modulator 12 as modulating signal. However, in DTV the system sampling rate is not many times higher than the carrier frequency $f_F$ of the final I-F signal so quantizing distortion is a problem. Analog filtering to suppress the quantizing distortion tends to be expensive and to introduce delay differences in the analog cos $\omega_F$t signal between various receivers which complicates the mass-manufacturing of receivers with as few production line adjustments as possible.

The ROMs 21 and 22 supply the digital complex multiplier 015 sample streams respectively descriptive of a cos $\omega_F$t system function and descriptive of a sin $\omega_F$t system function. These cos $\omega_F$t and sin $\omega_F$t system functions are delayed to compensate for the latent delays in the analog lowpass filter 13, the ADC 17, the phase-splitter 14, etc.

Figure 4:
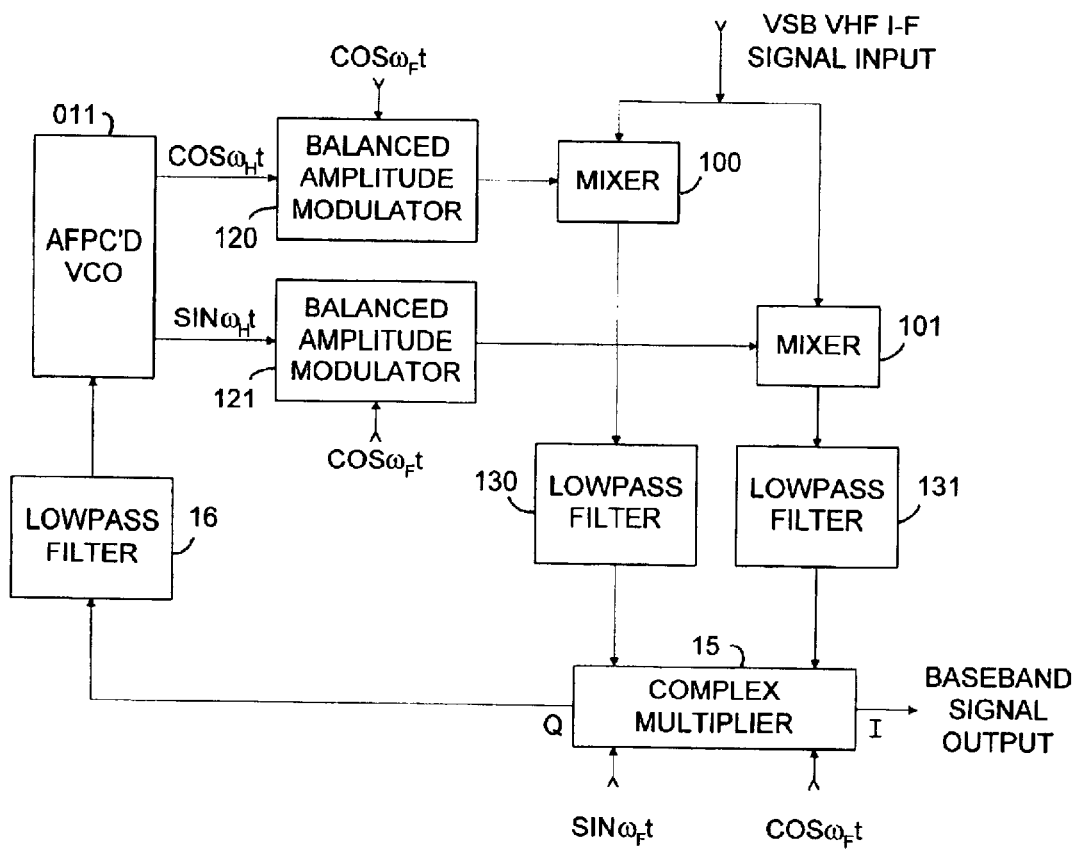
FIG. 4 is a conceptual block schematic diagram of apparatus for demodulating a vestigial-sideband amplitude-modulation signal in accordance with the method of the invention, which apparatus uses complex down conversion of the VSB AM signal to implement demodulation using a digital complex multiplier, rather than using a phase-splitter.

FIG. 4 shows a modification of the FIG. 1 portion of a VSB radio signal receiver that uses a complex mixer instead of the mixer 10 for downconverting VSB VHF I-F signal to DSB AM final I-F signal. This avoids the need for the phase-splitter 14 before the complex multiplier 15 used for demodulation. The complex mixer comprises component mixers 100 and 101 having their respective output signals filtered by lowpass filters 130 and 131, respectively. The lowpass filters 130 and 131 supply their responses to the complex multiplier 15 as real and imaginary signals, respectively. The mixers 100 and 101 receive similar VSB amplified VHF I-F signals as respective multiplicand input signals to be downconverted to a DSB AM final I-F signal, which VSB signals can be supplied from the customary gain-controlled VHF I-F amplifier chain. The FIG. 1 VCO 11 supplying cos $\omega_H$t real or in-phase local oscillations is replaced in FIG. 4 by a VCO 011 supplying sin $\omega_H$t imaginary or quadrature-phase local oscillations, as well as supplying cos $\omega_H$t real or in-phase local oscillations. The COS $\omega_H$t in-phase local oscillations from the VCO 011 are supplied to a balanced amplitude-modulator 120 there to be modulated by cos $\omega_F$t modulating signal to generate a multiplier input signal for the component mixer 100. The operation of the modulator 120, the mixer 100 and the lowpass filter 130 in the portion of a VSB signal receiver shown in FIG. 4 corresponds with the operation of the modulator 12, the mixer 10 and the lowpass filter 13 in the portion of a VSB signal receiver shown in FIG. 1. Accordingly, the response $R_{130}$ is an ensemble of terms each of the following form.

$$R_{130}=0.25 \cos (\omega_H-\omega_F-\omega_V)t+0.25 \cos (\omega_H+\omega_F-\omega_V)t \qquad (11)$$

The sine $\omega_H$t in-phase local oscillations from the VCO 011 are supplied to a balanced amplitude-modulator 121 there to be modulated by cos $\omega_F$t modulating signal to generate a multiplier input signal for the component mixer 101. In accordance with the trigonometric identity (3) set forth above, the response $R_{121}$ of the modulator 121 is of the following form.

$$R_{121}=0.5 \sin (\omega_H-\omega_F)t+0.5 \sin (\omega_H+\omega_F)t \qquad (12)$$

Further in accordance with the identity (3), the product output response $R_{101}$ from the mixer 101 to the multiplication of a cos $\omega_H$t multiplicand input signal by the $R_{121}$ multiplier input signal is an ensemble of terms each of the following form.

$$R_{101} = 0.25\sin(\omega_H - \omega_F - \omega_V)t + 0.25\sin(\omega_H - \omega_F + \omega_V)t + \\ 0.25\sin(\omega_H + \omega_F - \omega_V)t + 0.25\sin(\omega_H + \omega_F + \omega_V)t \qquad (13)$$

The lowpass filter 131 suppresses the high frequency terms in its response $R_{131}$ to the mixer 101 response $R_{101}$.

Accordingly, the response $R_{131}$ is an ensemble of terms each of the following form.

$$R_{131} = 0.25 \sin (\omega_H - \omega_F - \omega_V)t + 0.25 \sin (\omega_H + \omega_F - \omega_V)t \quad (14)$$

The lowpass filter 131 response $R_{131}$ in equation (14) preceding is the same as the imaginary response $Im_{14}$ of the phase-splitter 14 as set forth in equation (8) above, it is noted.

Figure 5:
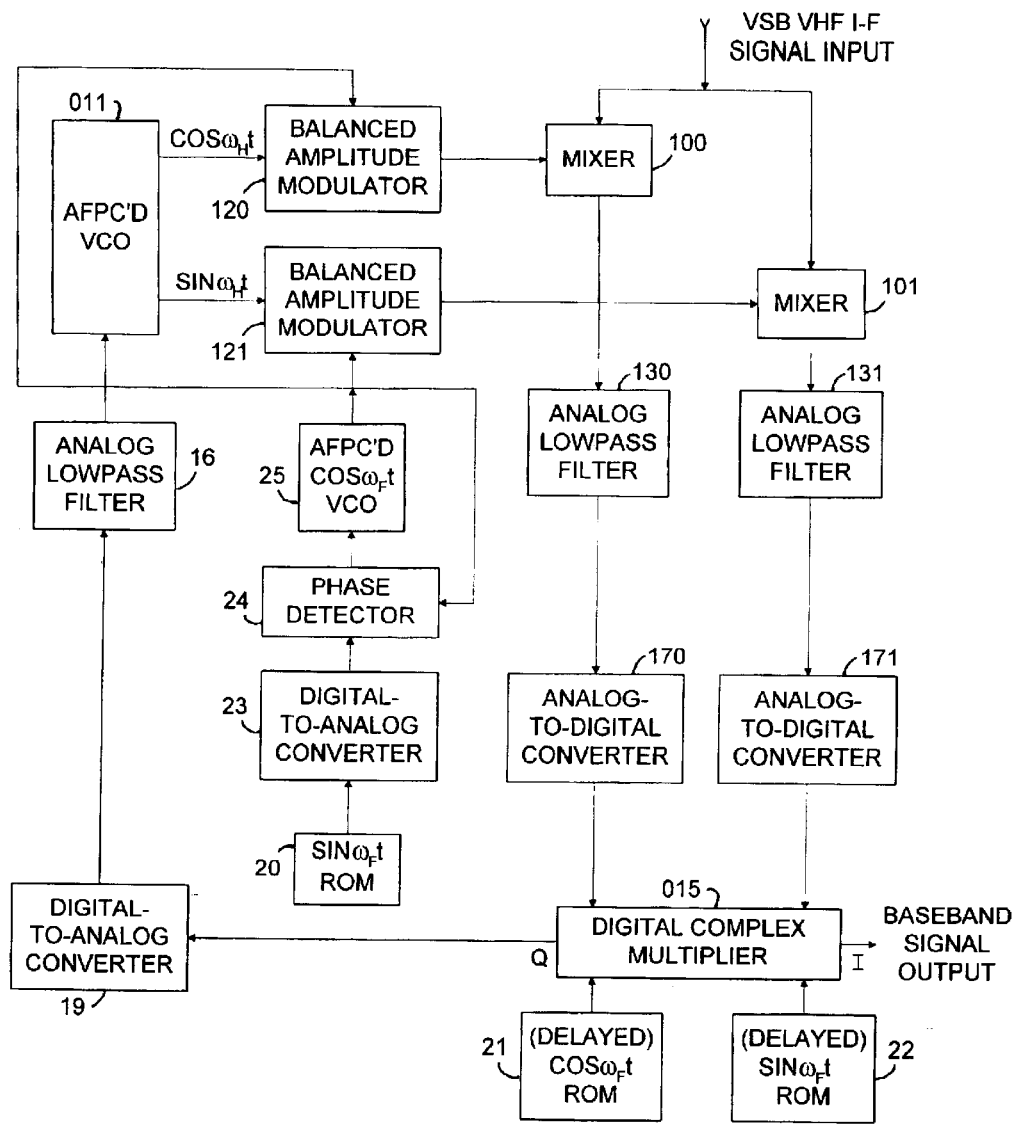
FIG. 5 is a block schematic diagram of apparatus for demodulating a vestigial-sideband amplitude-modulation signal, which apparatus embodies the invention and uses complex down conversion of the VSB AM signal to implement demodulation using a digital complex multiplier.

FIG. 5 shows modifications of the FIG. 3 portion of the VSB signal receiver to use the complex mixer composed of component mixers 100 and 101 rather than the mixer 10, so that the phase-splitter 014 of digital-filter type is not required for supplying complex multiplicand input signal to the digital complex multiplier 015. As in FIG. 4, FIG. 5 shows the component mixers 100 and 101 having their respective output signals filtered by lowpass filters 130 and 131, respectively. The mixers 100 and 101 receive similar VSB amplified VHF I-F signals as respective multiplicand input signals to be downconverted to a DSB AM final I-F signal, which VSB signals can be supplied from the customary gain-controlled VHF I-F amplifier chain. The FIG. 3 VCO 11 supplying cos $\omega_H t$ real or in-phase local oscillations is replaced in FIG. 5 by the VCO 011 supplying sin $\omega_H t$ imaginary or quadrature-phase local oscillations, as well as supplying cos $\omega_H t$ real or in-phase local oscillations. The cos $\omega_H t$ in-phase local oscillations from the VCO 011 are supplied to the balanced amplitude-modulator 120 there to be modulated by cos $\omega_F t$ modulating signal to generate a multiplier input signal for the component mixer 100. The operation of the modulator 120, the mixer 100 and the lowpass filter 130 in the portion of a VSB signal receiver shown in FIG. 5 corresponds with the operation of the modulator 12, the mixer 10 and the lowpass filter 13 in the portion of a VSB signal receiver shown in FIG. 3. As in FIG. 4, FIG. 5 shows the sine $\omega_H t$ in-phase local oscillations from the VCO 011 being supplied to the balanced amplitude-modulator 121 there to be modulated by cos $\omega_F t$ modulating signal to generate the multiplier input signal for the component mixer 101.

The responses $R_{130}$ and $R_{131}$ of the lowpass filters 130 and 131 are digitized by analog-to-digital converters 170 and 171, respectively, and the resulting real and imaginary components of the digitized DSB AM signal are applied to the digital complex multiplier 015 as real and imaginary signals, respectively. The in-phase response I supplied by the digital complex multiplier 015 as the real part of the complex product signal therefrom is a digital baseband signal, which is suited for application to subsequent portions of the receiver not shown in FIG. 5. These subsequent portions include baseband equalization and ghost cancellation filtering and subsequent symbol decoder apparatus. The quadrature-phase response Q supplied by the digital complex multiplier 015 as the imaginary part of the complex product signal therefrom is a digital baseband signal, which a digital-to-analog converter 19 converts to analog form to provide the input signal to the analog lowpass filter 16 that supplies AFPC signal to the VCO 011.

The ROMs 20, 21 and 22 in the FIG. 5 apparatus are connected and operated the same as in the FIG. 3 apparatus. The connection and the operation of elements 20, 23, 24 and 25 to generate a cos $\omega_F t$ modulating signal for the balanced amplitude-modulator 12 is the same in the FIG. 5 apparatus as in the FIG. 3 apparatus.

The invention as thusfar described converts the vestigial sideband (VSB) signal to a double-sideband amplitude-modulation signal in the analog regime, then digitizes the resulting DSB AM signal and demodulates the digitized DSB AM signal in the digital regime. Such arrangements require the analog mixer 10 (or each of the analog mixers 100 and 101 in a complex downconversion) to have good linearity with regard both to multiplier and multiplicand input signals. Switching converters are not possible if the multiplier signal in the downconversion comprises more than one carrier frequency.

In the embodiments of the invention described following, the DSB AM signal is generated in the digital regime, proceeding from the VSB signal as downconverted to include a carrier frequency offset from zero frequency by an amount greater than the bandwidth of the VSB signal. The downconverted VSB signal is digitized. Then, the digitized downconverted VSB signal is multiplied by a second harmonic of the carrier to generate another VSB signal, and the two digitized VSB signals are added together to complete generation of the DSB AM signal in the digital regime. There are embodiments of the invention in which the downconversion in the analog regime of the VSB signal to final I-F signal is done so as to recover the reversed frequency spectrum lower sideband shown in FIG. 2A, with the normal frequency spectrum upper sideband shown in FIG. 2B being created during digital processing. However, in the preferred embodiments of the invention described hereinafter, the downconversion in the analog regime of the VSB signal to final I-F signal is done so as to recover the normal frequency spectrum upper sideband shown in FIG. 2B, with the reversed frequency spectrum lower sideband shown in FIG. 2A being created during digital processing. This latter scheme for performing downconversion in the analog regime facilitates filtering to trap NTSC audio signals that might otherwise interfere with DTV reception.

Figure 6:
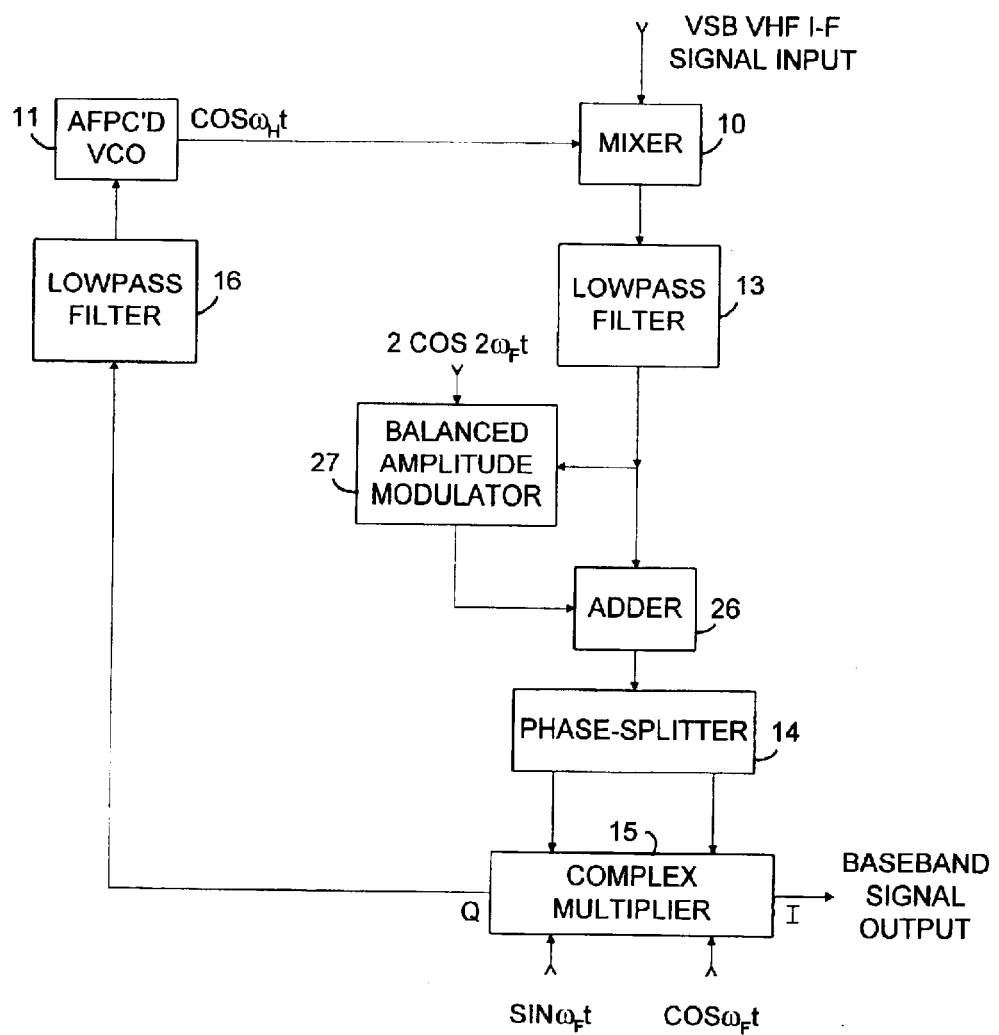
FIG. 6 is a conceptual block schematic diagram of alternative apparatus for demodulating in accordance with the method of the invention a vestigial-sideband amplitude-modulation signal, which apparatus includes a phase-splitter to implement demodulation using a digital complex multiplier.

FIG. 6 shows a portion of a VSB radio signal receiver following the customary gain-controlled VHF intermediate-frequency amplifier chain, which differs from the portion of a VSB radio signal receiver shown in FIG. 1 in the following ways. The VCO 11 supplies its oscillations at a very high frequency $f_H$ directly to the mixer 10 without the interposition of the balanced amplitude-modulator 12 of FIG. 1. The mixer 10 multiplies the VSB amplified VHF I-F signal by the heterodyning signal of frequency $f_H$ and the resulting product output signal from the mixer 10 is lowpass filtered by a lowpass filter 13 to separate a VSB final I-F signal with carrier frequency $f_F$ from its image in the VHF band. An adder 26 generates DSB AM signal as its sum output signal by combining two VSB signals received as summand input signals, one VSB signal providing the lower sideband of that DSB AM signal, and the other VSB signal providing the upper sideband of that DSB AM signal. The lowpass filter 13 response is one of the two summand input signals of the adder 26. The other summand input signal of the adder 26 is the product output signal of a balanced amplitude modulator 27 which modulates a suppressed carrier frequency $2f_F$ in accordance with the lowpass filter 13 response. The DSB AM signal that the adder 26 generates as its sum output signal is supplied to the phase-splitter 14 to generate the complex samples of the DSB AM signal that the complex multiplier 15 demodulates to recover baseband symbol code as an in-phase demodulation result and to recover AFPC loop error signal as a quadrature-phase demodulation result.

In the FIG. 6 downconversion circuitry, in accordance with the trigonometric identity (1), the response $R_{10}$ from the mixer 10 will be an ensemble of terms each of the following form, presuming the VCO 11 to be of the form COS $\omega_H t$.

$$R_{10} = 0.5 \cos (\omega_H - \omega_V)t + 0.5 \cos (\omega_H + \omega_V)t \quad (15)$$

The lowpass filter 13 suppresses the high frequency terms in its response $R_{13}$ to the mixer 10 response $R_{10}$, to generate an ensemble of terms each per the following equation (16).

$$R_{13}=0.5 \cos (\omega_H-\omega_V)t \qquad (16)$$

The balanced amplitude modulator 27 modulates a suppressed $2 \cos 2 \omega_F t$ carrier by the lowpass filter 13 response $R_{13}$ to generate in its response $R_{27}$, in accordance with the trigonometric identity (1), an ensemble of terms each per the following equation (17).

$$R_{27}=0.5 \cos (2\omega_F+\omega_H-\omega_V)t+0.5 \cos (2\omega_F-\omega_H+\omega_V)t \qquad (17)$$

The adder 26 sums $R_{13}$ and $R_{27}$ to generate a sum output signal $R_{26}$ which is an ensemble of terms each per the following equation (18).

$$R_{26} = R_{13} + R_{27} \qquad (18)$$
$$= 0.5\cos(\omega_H - \omega_V)t +$$
$$0.5\cos(2\omega_F + \omega_H - \omega_V)t + 0.5\cos(2\omega_F - \omega_H + \omega_V)t$$

The phase-splitter 14 repeats the adder 26 response $R_{26}$ as its real response $Re_{14}$, an ensemble of terms each per the following equation (19), and generates its imaginary response $Im_{14}$, an ensemble of corresponding terms each per the following equation (20).

$$Re_{14} = 0.5\cos(\omega_H - \omega_V)t + \qquad (19)$$
$$0.5\cos(2\omega_F + \omega_H - \omega_V)t + 0.5\cos(2\omega_F - \omega_H + \omega_V)t$$

$$Im_{14} = 0.5k\sin(\omega_H - \omega_V)t + \qquad (20)$$
$$0.5\sin(2\omega_F + \omega_H - \omega_V)t + 0.5\sin(2\omega_F - \omega_H + \omega_V)t$$

The following equations (21) describe the quadrature-phase response Q of the complex multiplier 15.

$$Q = Re_{14}\sin\omega_F t - Im_{14}\cos\omega_F t \qquad (21)$$
$$= 0.5\cos(\omega_H - \omega_V)t * \sin\omega_F t +$$
$$0.5\cos(2\omega_F + \omega_H - \omega_V)t * \sin\omega_F t +$$
$$0.5\cos(2\omega_F - \omega_H + \omega_V)t * \sin\omega_F t -$$
$$0.5\sin(\omega_H - \omega_V)t * \cos\omega_F t -$$
$$0.5\sin(2\omega_F + \omega_H - \omega_V)t * \cos\omega_F t -$$
$$0.5\sin(2\omega_F - \omega_H + \omega_V)t * \cos\omega_F t$$
$$= 0.5[\cos(\omega_H - \omega_V)t * \sin\omega_F t - \sin(\omega_H - \omega_V)t * \cos\omega_F t] +$$
$$0.5[\cos(2\omega_F + \omega_H - \omega_V)t * \sin\omega_F t -$$
$$\sin(2\omega_F + \omega_H - \omega_V)t * \cos\omega_F t] +$$
$$0.5[\cos(2\omega_F - \omega_H + \omega_V)t * \sin\omega_F t -$$
$$\sin(2\omega_F - \omega_H + \omega_V)t * \cos\omega_F t]$$
$$= +0.5\sin(\omega_F - \omega_H + \omega_V)t +$$
$$0.5\sin(\omega_F + \omega_H - \omega_V)t +$$
$$0.5\sin(\omega_F - \omega_H + \omega_V)t$$
$$= \sin(\omega_F - \omega_H + \omega_V)t + 0.5\sin(\omega_F + \omega_H - \omega_V)t$$

Presuming $(\omega_H-\omega_V)$ to be approximately $\omega_F$, the lowpass filter 16 suppresses the higher frequency $\cos 0.5 \sin (\omega_F+\omega_H-\omega_V)t$ component of the Q signal, to generate a response $R_{16}$ that within the AFPC bandwidth is an ensemble of terms each per the following equation (22).

$$R_{16}=\sin (\omega_F-\omega_H+\omega_V)t \qquad (22)$$

$R_{16}$ is an AFPC signal that will adjust $\omega_H$ so that $(\omega_H-\omega_V)$ equals $\omega_F$ to reduce error signal substantially to zero.

The following equations (23) describe the in-phase response I of the complex multiplier 15.

$$I = Re_{14}\cos\omega_F t - Im_{14}\sin\omega_F t \qquad (23)$$
$$= +0.5\cos(\omega_H - \omega_V)t * \cos\omega_F t +$$
$$0.5\cos(2\omega_F + \omega_H - \omega_V)t * \cos\omega_F t +$$
$$0.5\cos(2\omega_F - \omega_H + \omega_V)t * \cos\omega_F t +$$
$$0.5\sin(\omega_H - \omega_V)t * \sin\omega_F t +$$
$$0.5\sin(2\omega_F + \omega_H - \omega_V)t * \sin\omega_F t +$$
$$0.5\sin(2\omega_F - \omega_H + \omega_V)t * \sin\omega_F t$$
$$= +0.5[\cos(\omega_H - \omega_V)t * \cos\omega_F t + \sin(\omega_H - \omega_V)t * \sin\omega_F t] +$$
$$0.5[\cos(2\omega_F + \omega_H - \omega_V)t * \cos\omega_F t +$$
$$\sin(2\omega_F + \omega_H - \omega_V)t * \sin\omega_F t] +$$
$$0.5[\cos(2\omega_F - \omega_H + \omega_V)t * \cos\omega_F t +$$
$$\sin(2\omega_F - \omega_H + \omega_V)t * \sin\omega_F t]$$
$$= +0.5\cos(\omega_F - \omega_H + \omega_V)t +$$
$$0.5\cos(\omega_F + \omega_H - \omega_V)t +$$
$$0.5\cos(\omega_F - \omega_H + \omega_V)t$$
$$= \cos(\omega_F - \omega_H + \omega_V)t + 0.5\cos(\omega_F + \omega_H - \omega_V)t$$

Suppose that $(\omega_V-\omega_H)$ exhibits variation of higher frequency than the AFPC time constant. Each component of the ensemble descriptive of these variations is assumed to have a $(\omega_H-\omega_V)$ value of $(\omega_F+\omega_M)$. When the AFPC loop is phase-locked, the in-phase response I of the complex multiplier 15 will be an ensemble of the following component I responses, as determined by substituting $(\omega_F+\omega_M)$ for $(\omega_H-\omega_V)$ in equation (24).

$$I = \cos(-\omega_M)t + 0.5\cos(2\omega_F + \omega_M)t \qquad (24)$$
$$= \cos\omega_M t + 0.5\cos(2\omega_F + \omega_M)t$$

Figure 7:
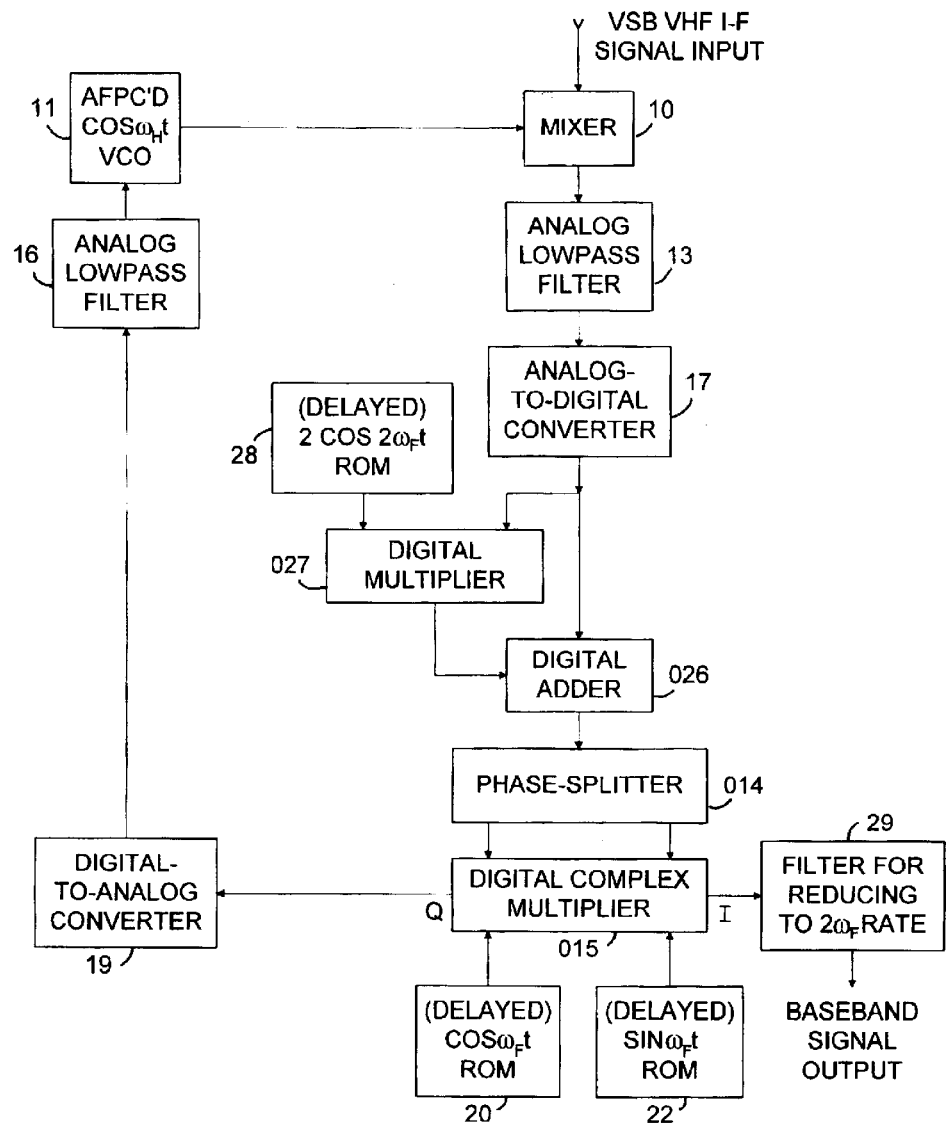
FIG. 7 is a block schematic diagram of apparatus for demodulating a vestigial-sideband amplitude-modulation signal, which apparatus embodies the invention.

FIG. 7 shows in more detail how the FIG. 6 concept is implemented when the demodulation is carried out in the digital regime, with the phase splitter 14 being the phase-splitter 014 of digital-filter type and the complex multiplier 15 being the digital complex multiplier 015. The lowpass filter 13 response $R_{13}$ is digitized by the analog-to-digital converter 17. The resulting digitized VSB signal is applied as a first of its two summand input signals to a digital adder 026 and is applied as a multiplicand input signal to a digital multiplier 027. A read-only memory 28 is addressed in parallel with the ROM 21 and 22, which supply the digital complex multiplier 015 sample streams respectively descriptive of a $\cos \omega_F t$ system function and descriptive of a $\sin \omega_F t$ system function. The ROM 28 supplies the digital multiplier 027 as the multiplier input signal thereof a sample stream descriptive of a $\cos 2\omega_F t$ system function, which is delayed to compensate for the latent delays in the mixer 10, the analog lowpass filter 13 and the ADC 17. The product output signal from the digital multiplier 027 is applied to the digital adder 026 as the second of its two summand input signals. The sum output signal of the digital adder 026 supplied to the phase-splitter 014 as its input signal comprises a DSB AM signal component.

The in-phase response I supplied by the digital complex multiplier 015 as the real part of the complex product signal therefrom is a digital baseband signal accompanied by a sideband of the cos $2\omega_F t$ carrier in accordance with equation (24). A rate-reduction filter 29 with $2\omega_F$ output sample rate receives this in-phase response I and aliases the sideband of the cos $2\omega_F t$ carrier to baseband to augment the baseband signal. The rate-reduced I response from the rate-reduction filter 29 is suited for application to subsequent portions of the receiver not shown in FIG. 7. These subsequent portions include baseband equalization and ghost cancellation filtering and subsequent symbol decoder apparatus. The quadrature-phase response Q supplied by the digital complex multiplier 015 as the imaginary part of the complex product signal therefrom is a digital baseband signal, which a digital-to-analog converter 19 converts to analog form to provide the input signal to the analog lowpass filter 16 that supplies AFPC signal to the VCO 11.

Figure 8:
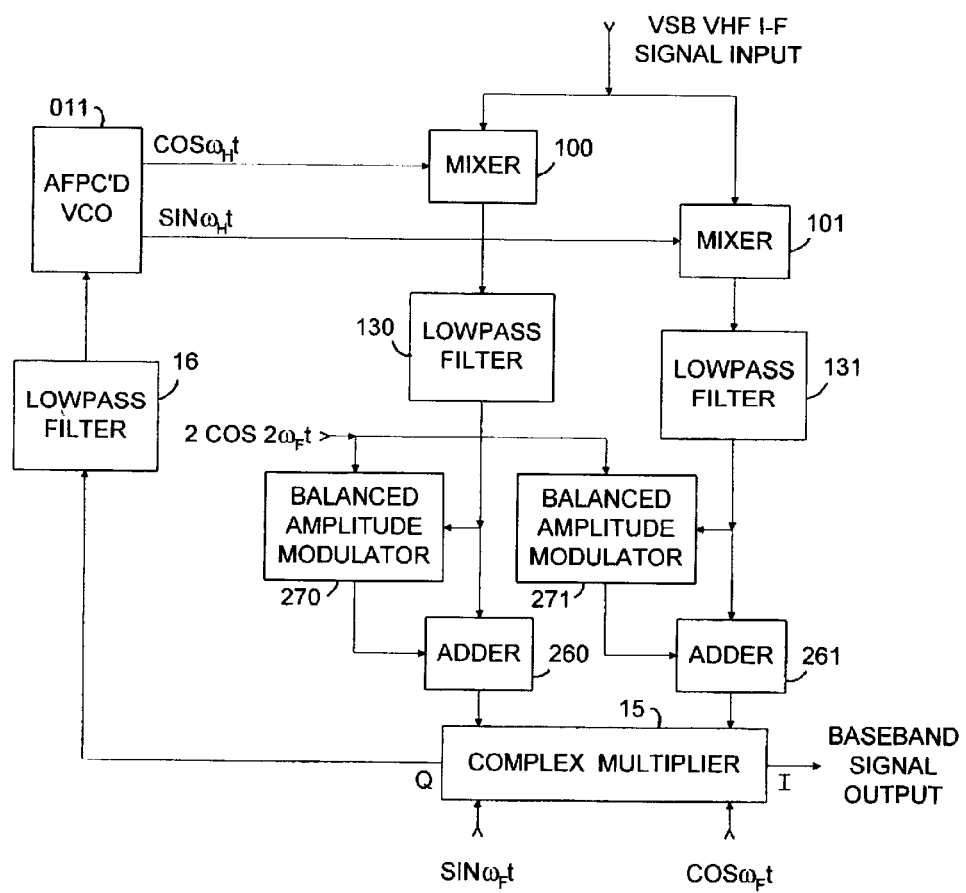
FIG. 8 is a conceptual block schematic diagram of apparatus for demodulating a vestigial-sideband amplitude-modulation signal in accordance with the method of the invention, which apparatus uses complex down conversion of the VSB AM signal to implement demodulation using a digital complex multiplier, rather than using a phase-splitter.

FIG. 8 shows a modification of the FIG. 6 portion of a VSB radio signal receiver that uses a complex mixer instead of the mixer 10 for downconverting VSB VHF I-F signal to VSB final I-F signal. This avoids the need for the phase-splitter 14 before the complex multiplier 15 used for demodulation. The complex mixer comprises component mixers 100 and 101 having their respective output signals filtered by lowpass filters 130 and 131, respectively. The lowpass filter 130 response is applied as the first of two summand input signals to an adder 260. The other summand input signal of the adder 260 is the product output signal of a balanced amplitude modulator 270 which modulates a suppressed carrier frequency $2\omega_F$ in accordance with the lowpass filter 130 response. The sum output signal that the adder 260 generates includes DSB AM of a $\omega_F$ carrier and is supplied to the complex multiplier 15 as a real component of final I-F input signal. The lowpass filter 131 response is applied as the first of two summand input signals to an adder 261. The other summand input signal of the adder 261 is the product output signal of a balanced amplitude modulator 271 which modulates a suppressed carrier frequency $2\omega_F$ in accordance with the lowpass filter 131 response. The sum output signal that the adder 261 generates includes DSB AM of a $\omega_F$ carrier and is supplied to the complex multiplier 15 as an imaginary component of final I-F input signal.

The mixers 100 and 101 receive similar VSB amplified VHF I-F signals as respective multiplicand input signals to be downconverted, which VSB signals can be supplied from the customary gain-controlled VHF I-F amplifier chain. The FIG. 6 VCO 11 supplying cos $\omega_H t$ real or in-phase local oscillations is replaced in FIG. 8 by a VCO 011 supplying sin $\omega_H t$ imaginary or quadrature-phase local oscillations, as well as supplying cos $\omega_H t$ real or in-phase local oscillations. The cos $\omega_H t$ in-phase local oscillations from the VCO 011 are applied as multiplier input signal to the component mixer 100. The operation of the modulator 120, the mixer 100, the lowpass filter 130, the adder 260 and the multiplier 270 in the portion of a VSB signal receiver shown in FIG. 8 corresponds with the operation of the modulator 12, the mixer 10, the lowpass filter 13, the adder 26 and the multiplier 27 in the portion of a VSB signal receiver shown in FIG. 6. So, in accordance with equation (18) the sum output signal $R_{260}$ from the adder 260 is an ensemble of terms each per the following equation (25).

$$R_{260} = R_{130} + R_{270} \quad (25)$$
$$= 0.5\cos(\omega_H - \omega_V)t +$$
$$0.5\cos(2\omega_F + \omega_H - \omega_V)t + 0.5\cos(2\omega_F - \omega_H + \omega_V)t$$

The sin $\omega_H t$ in-phase local oscillations from the VCO 011 are applied as multiplier input signal to the component mixer 101, in accordance with the trigonometric identity (3), the response $R_{101}$ from the mixer 101 will be an ensemble of terms each of the following form, presuming the VCO 111 to be of the form cos $\omega_H t$.

$$R_{101} = 0.5 \sin (\omega_H - \omega_V)t + 0.5 \sin (\omega_H + \omega_V)t \quad (26)$$

The lowpass filter 131 suppresses the high frequency terms in its response $R_{13}$ to the mixer 10 response $R_{10}$, to generate an ensemble of terms each per the following equation (27).

$$R_{13} = 0.5 \sin (\omega_H - \omega_V)t \quad (27)$$

The balanced amplitude modulator 271 modulates a suppressed 2 cos 2 $\omega_F t$ carrier by the lowpass filter 131 response $R_{131}$ to generate in its response $R_{271}$, in accordance with the trigonometric identity (3), an ensemble of terms each per the following equation (28).

$$R_{271} = 0.5 \sin (2\omega_F + \omega_H - \omega_V)t + 0.5 \sin (2\omega_F - \omega_H + \omega_V)t \quad (28)$$

The adder 261 sums $R_{131}$ and $R_{271}$ to generate a sum output signal $R_{261}$ which is an ensemble of terms each per the following equation (29).

$$R_{261} = R_{131} + R_{271} \quad (29)$$
$$= 0.5\sin(\omega_H - \omega_V)t +$$
$$0.5\sin(2\omega_F + \omega_H - \omega_V)t + 0.5\sin(2\omega_F - \omega_H + \omega_V)t$$

The adder 130 response $R_{130}$ in equation (25) and the adder 131 response $R_{131}$ in equation (29) respectively correspond to the real response $Re_{14}$ of the phase-splitter 14 per equation (19) and to the imaginary response $Im_{14}$ of the phase-splitter 14 per equation (20).

Figure 9:
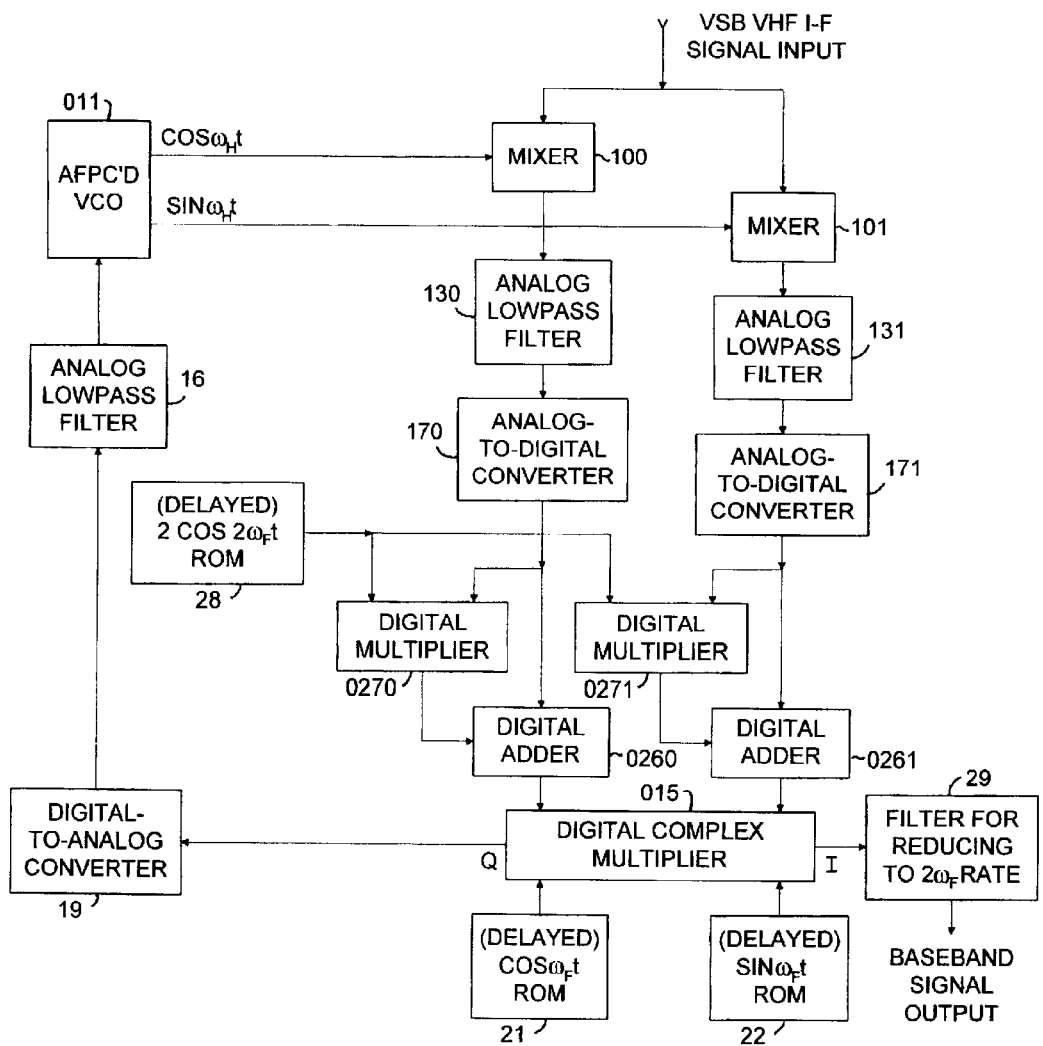
FIG. 9 is a block schematic diagram of apparatus for demodulating a vestigial-sideband amplitude-modulation signal, which apparatus embodies the invention and uses complex down conversion of the VSB AM signal to implement demodulation using a digital complex multiplier.

FIG. 9 shows modifications of the FIG. 7 portion of the VSB signal receiver to use the complex mixer composed of component mixers 100 and 101 rather than the mixer 10, so that the phase-splitter 014 of digital-filter type is not required for supplying complex multiplicand input signal to the digital complex multiplier 015. As in FIG. 8, FIG. 9 shows the component mixers 100 and 101 having their respective output signals filtered by lowpass filters 130 and 131, respectively. The mixers 100 and 101 receive similar VSB amplified VHF I-F signals as respective multiplicand input signals to be downconverted to VSB final I-F signals, which VSB VHF I-F signals can be supplied from the customary gain-controlled VHF I-F amplifier chain. The FIG. 7 VCO 11 supplying cos $\omega_H t$ real or in-phase local oscillations is replaced in FIG. 9 by the VCO 011 supplying sin $\omega_H t$ imaginary or quadrature-phase local oscillations, as well as supplying cos $\omega_H t$ real or in-phase local oscillations. The cos $\omega_H t$ in-phase local oscillations from the VCO 011 are supplied to the component mixer 100 as multiplier input signal thereto. The operation of the modulator 120, the mixer 100 and the lowpass filter 130 in the portion of a VSB signal receiver shown in FIG. 9 corresponds with the operation of the modulator 12, the mixer 10 and the lowpass filter 13 in the portion of a VSB signal receiver shown in FIG. 7. As in FIG. 8, FIG. 9 shows the sine $\omega_H t$ in-phase local oscillations from the VCO 011 being supplied to the component mixer 101 as multiplier input signal thereto.

The responses $R_{130}$ and $R_{131}$ of the lowpass filters 130 and 131 are digitized by analog-to-digital converters 170 and 171, respectively. The digitized VSB signal from the ADC 170 is applied as a first of its two summand input signals to a digital adder 0260 and is applied as a multiplicand input signal to a digital multiplier 0270. The digitized VSB signal from the ADC 171 is applied as a first of its two summand input signals to a digital adder 0261 and is applied as a multiplicand input signal to a digital multiplier 0271. The ROMs 21, 22 and 28 in the FIG. 9 apparatus are connected and operated the same as in the FIG. 7 apparatus. The ROM 28 supplies a sample stream descriptive of a 2 cos $2\omega_F t$ system function applied to the digital multipliers 0270 and 0271 as the multiplier input signals thereof. The sum output signals from the digital adders 0260 and 0261 are supplied to the digital complex multiplier 015 as real and imaginary signals, respectively.

The in-phase response I supplied by the digital complex multiplier 015 as the real part of the complex product signal therefrom is a digital baseband signal accompanied by a sideband of the cos $2\omega_F t$ carrier in accordance with equation (24). A rate-reduction filter 29 with $2\omega_F$ output sample rate receives this in-phase response I and aliases the sideband of the cos $2\omega_F t$ carrier to baseband to augment the baseband signal. The rate-reduced I response from the rate-reduction filter 29 is suited for application to subsequent portions of the receiver not shown in FIG. 7. These subsequent portions include baseband equalization and ghost cancellation filtering and subsequent symbol decoder apparatus. The quadrature-phase response Q supplied by the digital complex multiplier 015 as the imaginary part of the complex product signal therefrom is a digital baseband signal, which the digital-to-analog converter 19 converts to analog form to provide the input signal to the analog lowpass filter 16 that supplies AFPC signal to the VCO 011.

Figure 10:
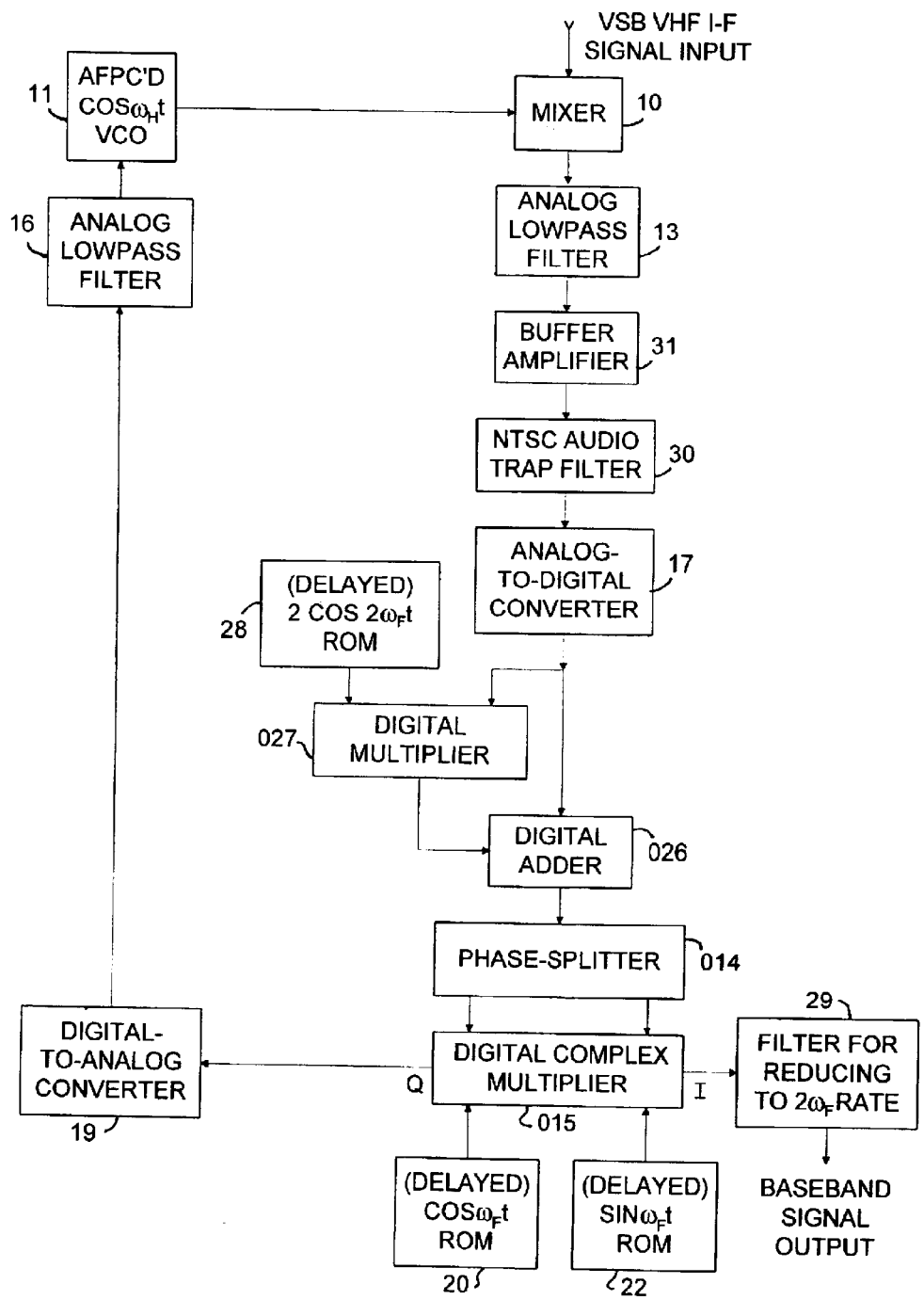
FIG. 10 is a block schematic diagram of FIG. 7 apparatus for demodulating a vestigial-sideband digital television (DTV) signal, as modified by the introduction of NTSC sound trap filtering before digitization of the final intermediate-frequency signal.

FIG. 10 shows the FIG. 7 apparatus for demodulating a VSB DTV signal, as modified to include NTSC sound trap filtering 30 of the final I-F signal before the ADC 17. FIG. 10 also shows a buffer amplifier 31 for applying the response of the analog lowpass filter 13 to the NTSC sound trap filtering 30. The buffer amplifier 31 presents high input impedance loading on the analog lowpass filter 13 and low output impedance as source impedance for the NTSC sound trap filtering 30. The NTSC sound trap filtering 30 can comprise a trap filter for co-channel interfering NTSC sound carrier, or a trap filter for adjacent channel NTSC sound carrier, or trap filters for both types of NTSC sound carrier. Since the NTSC sound carriers accompanying the final I-F signal are more than 5 megahertz above zero frequency when the mixer 101 is designed to recover an upper sideband of the VSB signal as downconverted to final I-F band, the trap filters can be configurations such as bridged-tee filters that are known in analog television receiver design.

Figure 11:
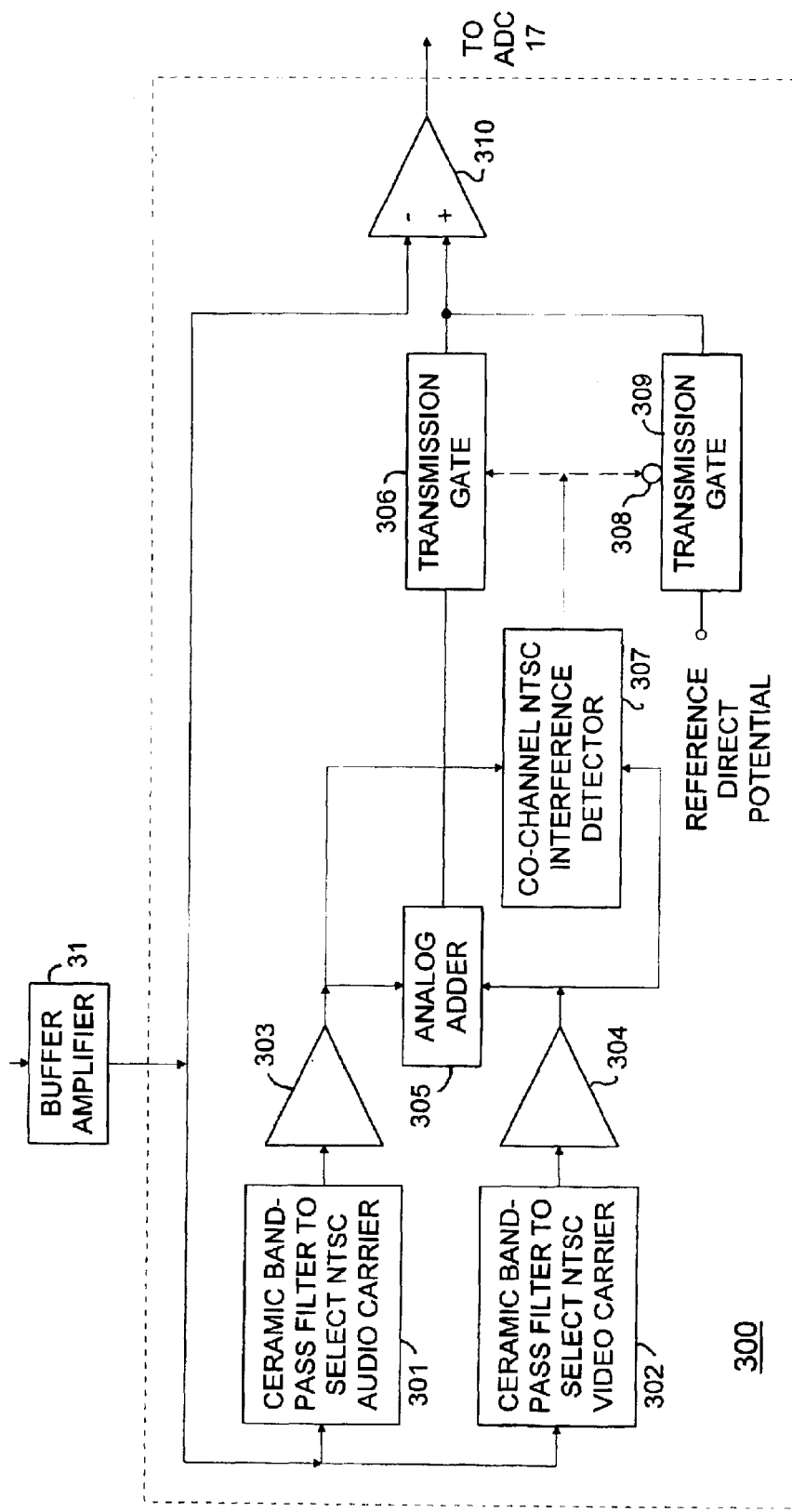
FIG. 11 is a schematic diagram of trap filtering for co-channel interfering NTSC analog television signal, which trap filtering is suitable for inclusion in the DTV signal receiver of FIG. 10.

FIG. 11 shows NTSC trap filtering 300 as described by A. L. R. Limberg and C. B. Patel in their U.S. Pat. No. 6,496,230 titled "DIGITAL TV SIGNAL RECEIVER WITH DIRECT CONVERSION FROM UHF I-F TO LOW-BAND I-F BEFORE DIGITAL DEMODULATION". The FIG. 10 apparatus can be modified to replace the NTSC sound trap filtering 30 with the NTSC trap filtering 300. The NTSC trap filtering 300 suppress portions of any co-channel interfering NTSC signal proximate the video carrier, as well as portions of any co-channel interfering NTSC signal proximate the audio carrier. The NTSC trap filtering 300, which comprises elements 301–310, is preferred for the ease with which it can be disabled when there is no significant level of co-channel interfering NTSC signal. The low-band I-F buffer amplifier 31 output signal is applied to the non-inverting input terminal of a differential-input amplifier 310, the low-band I-F output signal of which amplifier 310 is digitized by the ADC 17 of FIG. 10.

FIG. 11 shows the low-band buffer amplifier 31 connected for supplying its output signal to a ceramic bandpass filter 301, which selectively responds to a frequency range including the audio carrier of the co-channel interfering NTSC signal, and to a ceramic bandpass filter 302, which selectively responds to a frequency range including the video carrier of the co-channel interfering NTSC signal. The frequency range to which the ceramic bandpass filter 301 selectively responds can, for example, extend about ±50 kilohertz each side of the audio carrier of the co-channel interfering NTSC signal as translated to the low-band final I-F band. By way of further example, the frequency range that the ceramic bandpass filter 301 selectively responds to can be extended somewhat further from the NTSC audio carrier towards the edge of the reception channel closest by the NTSC audio carrier.

The frequency range to which the ceramic bandpass filter 302 selectively responds should be within a frequency range substantially within a wider frequency range extending 896.9 to 978.4 kHz from DTV carrier as translated to the low-band final I-F band. This avoids the ceramic bandpass filter 302 response including any subharmonic of symbol rate, since the tenth and eleventh subharmonics respectively fall 978.4 kHz and 896.9 kHz from DTV carrier.

The ceramic bandpass filter 301 response is applied as input signal to a voltage amplifier 303, and the ceramic bandpass filter 302 response is applied as input signal to a voltage amplifier 304. An analog adder 305 sums the responses of the voltage amplifiers 303 and 304 to generate a sum signal that a transmission gate 306 selectively applies to the inverting input terminal of the differential-input amplifier 310. The voltage gain of the voltage amplifier 303 is chosen to compensate for insertion losses for the signal passed through the ceramic bandpass filter 301, the adder 305, and the conductive transmission gate 306. The voltage gain of the voltage amplifier 30 is chosen to compensate for insertion losses for the signal passed through the ceramic bandpass filter 302, the adder 305, and the conductive transmission gate 306.

The transmission gate 306 is rendered conductive by a co-channel NTSC interference detector 307 supplying an indication that there is a co-channel interfering NTSC signal of enough energy to significantly affect data slicing and other symbol decoding procedures. The co-channel NTSC interference detector 307 can take a number of forms, but a preferred form multiplicatively mixes the responses of the ceramic bandpass filters 301 and 302 one with the other, which generates a continuous 4.5 MHz intercarrier signal whenever co-channel interfering NTSC signal is present in the low-band I-F buffer amplifier 31 output signal. As a practical consideration, the 4.5 MHz intercarrier signal is not generated when only DTV signal is being received. A bandpass filter selects the 4.5 MHz intercarrier signal for envelope detection, and the envelope detection result is threshold detected for determining whether or not a 4.5 MHz intercarrier signal of significant energy results from multiplicatively mixing the responses of the ceramic bandpass filters 301 and 302 one with the other.

The co-channel NTSC interference detector 307 indications are supplied to a logic inverter 308, the response of which controls transmission through a transmission gate 309. The transmission gate 309 is rendered non-conductive when the co-channel NTSC interference detector 307 supplies an indication that there is a co-channel interfering NTSC signal of enough energy to significantly affect data slicing and other symbol decoding procedures. The concurrent conduction of the transmission gate accordingly 306 applies to the inverting input terminal of the differential-input amplifier 310 a signal corresponding to the portions of the low-band I-F buffer amplifier 31 output signal in the frequency regions near the NTSC audio carrier and near the NTSC video carrier. Shimming delay is included in the FIG. 11 circuitry so that the low-band I-F buffer amplifier 31 output signal applied to the non-inverting input terminal of the differential-input amplifier 310 is delayed similarly to the responses of the responses of the ceramic bandpass filters 301 and 302 as selectively applied to the inverting input terminal of the differential-input amplifier 310. Accordingly, the differential-input amplifier 310 exhibits suppressed response to the portions of the buffer amplifier 31 output signal in the frequency regions near the NTSC audio carrier and near the NTSC video carrier, as compared to the response to other portions of the low-band I-F buffer amplifier 31 output signal.

The transmission gate 306 is rendered non-conductive by the co-channel NTSC interference detector 307 supplying an indication that there is no co-channel interfering NTSC signal with enough energy to significantly affect data slicing and other symbol decoding procedures. This indication renders the transmission gate 309 conductive to apply a reference direct potential to the inverting input terminal of the differential-input amplifier 310. Accordingly, the differential-input amplifier 310 exhibits response to the entire low-band I-F buffer amplifier 31 output signal. That is, if there is no co-channel interfering NTSC signal with enough energy to significantly affect data slicing and other symbol decoding procedures, the DTV signal is not subjected to trap filtering.

Thusfar, it has been presumed that the shaping of the channel response of the receiver in the carrier-frequency region is accomplished primarily in the UHF or VHF intermediate-frequency amplifiers preceding the mixer 10 used for downconverting to the final I-F band. Insofar as in-phase demodulation of the DSB AM DTV signal is concerned, it is desirable that the DTV receiver introduce roll-off through the carrier-frequency region to augment by an additional 3 dB the 3 dB roll-off introduced at the DTV transmitter. This results in an overall channel response which after demodulation is nominally flat down to zero frequency, reducing the amount of equalization that must be introduced at these frequencies. However, insofar as quadrature-phase demodulation of the DSB AM DTV signal is concerned, it is preferable not to roll off the I-F amplifier responses in the carrier frequency region. Phase response is less affected in the carrier-frequency region if further roll-off of channel response in this region is avoided, although the VSB-to-DSB-AM conversion techniques of the invention substantially avoid this deleterious effect. Avoiding farther roll-off of channel response in the carrier-frequency region avoids some loss of carrier-to-noise ratio caused by quantization noise introduced during digitization of the final I-F signal.

Figure 12:
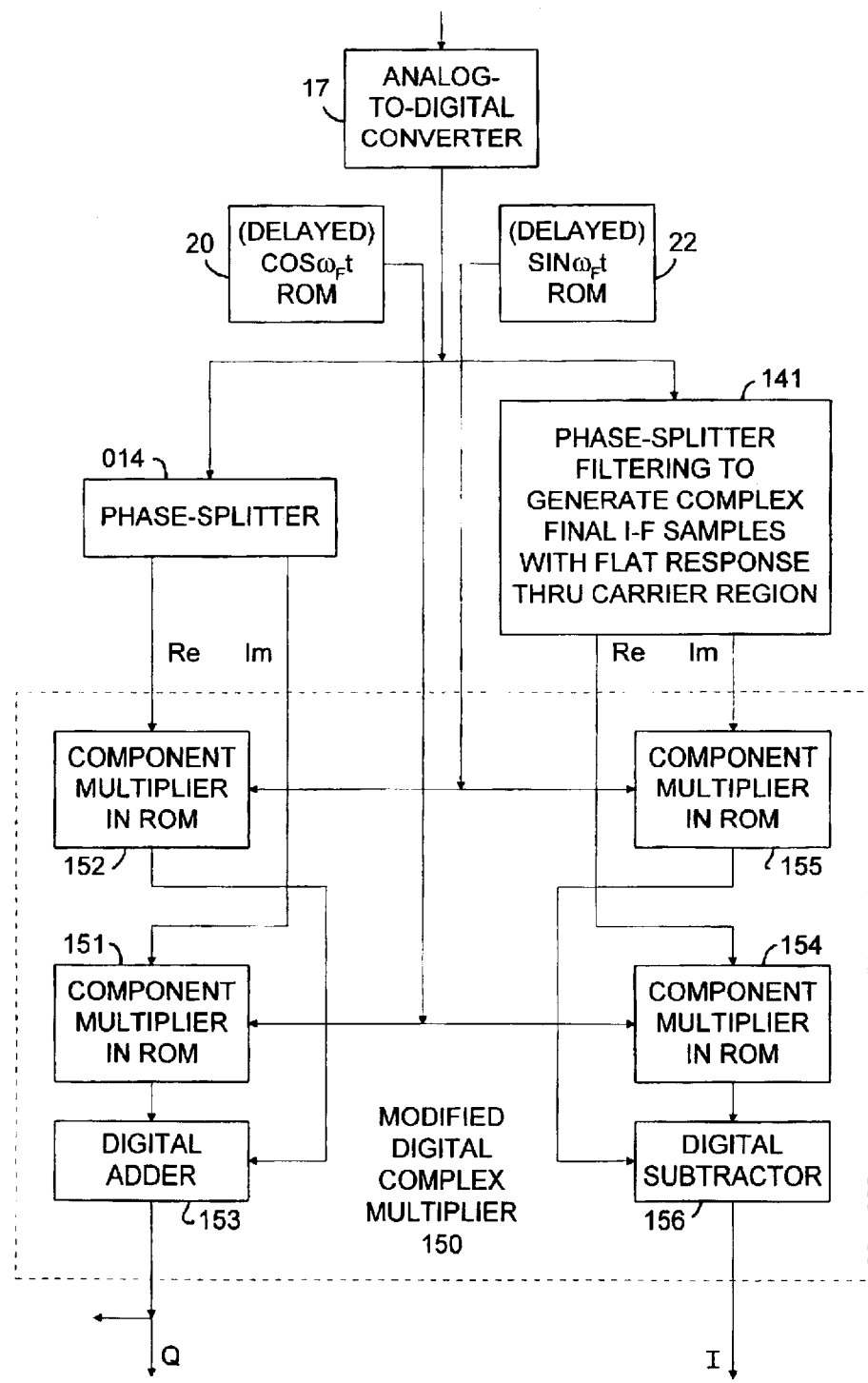
FIG. 12 is a schematic diagram of a modification to the FIG. 3 circuitry in regard to processing the digitized final I-F signal from the analog-to-digital converter, which modification is useful if roll-off of channel response in the carrier-frequency region is avoided in the intermediate-frequency amplifier chain.

FIG. 12 shows modification to the FIG. 3 circuitry in regard to processing the digitized final I-F signal from the analog-to-digital converter 17, which modification is useful if further roll-off of channel response in the carrier-frequency region is avoided in the intermediate-frequency amplifier chain. The digital complex multiplier 015 is replaced by a modified digital complex multiplier 150, and phase-splitter filtering 141 augments the phase-splitter 014. The modified digital complex multiplier 150 receives real and imaginary streams of samples from the phase-splitter 014 as input signal for the portion of that modified complex multiplier comprising elements 151–153 that generates the quadrature-phase (Q) portion of the complex product input signal, but not for the portion of that modified complex multiplier comprising elements 154–156 that generates the in-phase (I) portion of the complex product. Instead, the modified digital complex multiplier 150 receives real and imaginary streams of samples from phase-splitting filtering 141 as input signal for the portion of that modified complex multiplier comprising elements 154–156 that generates the in-phase (I) portion of the complex product. The phase-splitter filtering 141 exhibits a dip in system function at the middle of the final I-F band to provide an amplitude-versus-frequency response that preferably is flat through the region of carrier frequency insofar as the overall channel response is concerned.

Digital multipliers 151, 152, 154 and 155 are included within the modified digital complex multiplier 150. In order that the latent delay in generating product signals be minimized, the digital multipliers 151, 152, 154 and 155 are preferably constructed using read-only memory, rather than using logic circuitry and registers for multiplier and multiplicand signals. The digital multiplier 151 multiplies the imaginary component of the digitized final I-F signal from the phase-splitter 014 by the real component of the complex digital carrier read from the ROM 20. The digital multiplier 152 multiplies the real component of the digitized final I-F signal from the phase-splitter 014 by the imaginary component of the complex digital carrier read from the ROM 22. The digital adder 153 sums the product output signals from the digital multipliers 151 and 52 to generate a sum output signal supplied as the quadrature-phase (Q) baseband output signal from the modified digital complex multiplier 150. The digital multiplier 154 multiplies the real component of the digitized final I-F signal from the phase-splitter filtering circuitry 141 by the real component of the complex digital carrier read from the ROM 20. The digital multiplier 155 multiplies the imaginary component of the digitized final I-F signal from the phase-splitter filtering circuitry 141 by the imaginary component of the complex digital carrier read from the ROM 22. The digital subtractor 156 differentially combines the product output signals from the digital multipliers 154 and 155 to generate a difference output signal supplied as the in-phase (I) baseband output signal from the modified digital complex multiplier 150.

Further modifications of the modified digital complex multiplier 150 reduce the amount of ROM required overall, but provide equivalent function insofar as synchrodyning DSB AM signal to baseband is concerned. In these further modifications the digital multipliers 151, 152, 154 and 155 are replaced by ROMs directly addressed from the address generator previously used for addressing the ROMs 20 and 22, and the ROMs 20 and 22 are dispensed with. The digital complex multiplier 015 can also be modified to use this reduced-ROM structure.

While the invention has been described in the particular context of DTV receivers, it should be appreciated that the invention is useful, as well, for the reception of VSB radio signals used in other types of communications.

What is claimed is:

1. An apparatus for practicing a method for extracting information from a vestigial sideband amplitude-modulation signal generated in accordance with a modulating signal, said method for extracting information from said vestigial sideband amplitude-modulation signal comprising the steps of:

mixing said vestigial sideband amplitude-modulation signal with a first beat frequency different from a earner frequency of said vestigial sideband amplitude-modulation signal, said first beat frequency being of such value as to generate a first mixing result that is translated in frequency to have a carrier at an offset frequency;

mixing said vestigial sideband amplitude-modulation signal with a second beat frequency different from the carrier frequency of said vestigial sideband amplitude-modulation signal and from said first beat frequency, said second beat frequency being of such value as to generate a second mixing result that is translated in frequency to have a carrier at said offset frequency; and combining said first and second mixing results, which have respective frequency spectra that are images of each other, to form said double-sideband amplitude-modulation signal with its carrier frequency at said offset frequency;

for converting said vestigial sideband amplitude-modulation signal to said double-sideband amplitude-modulation signal containing similar information, and said method for extracting information from said vestigial sideband amplitude-modulation signal further comprising the step of detecting the information contained in said double-sideband amplitude-modulation signal, said apparatus comprising:

a local oscillator for generating local oscillations of a frequency and phase controlled by an automatic-frequency-and-phase-control signal;

a balanced modulator connected for amplitude-modulating said local oscillations in accordance with said offset frequency, to generate a balanced modulator output signal essentially consisting of a first beat frequency component and a second beat frequency component;

a mixer connected for mixing said balanced modulator output signal with said vestigial sideband amplitude-modulation signal, to generate a mixer output signal including said double-sideband amplitude-modulation signal;

an image-rejection filter connected for supplying said double-sideband amplitude-modulation signal as a selective response to said mixer output signal;

a phase-splitter connected for generating a complex response to said double-sideband amplitude-modulation signal said image-rejection filter supplies as a selective response to said mixer output signal;

a complex multiplier connected for multiplying said complex response to said double-sideband amplitude-modulation signal by a complex carrier the frequency of which equals said offset frequency, to generate an in-phase synchronous detection response and a quadrature-phase synchronous detection response; and circuitry for generating said automatic-frequency-and-phase-control signal from said quadrature-phase synchronous detection response supplied thereto, which automatic-frequency-and-phase-control signal is applied to said local oscillator to complete an automatic-frequency-and-phase-control loop for adjusting the frequency and phase of the local oscillations generated by said local oscillator so that said in-phase synchronous detection response reproduces the modulating signal in accordance with which said vestigial sideband amplitude-modulation signal was generated.

2. The apparatus of claim 1, wherein said circuitry for generating said automatic-frequency-and-phase-control signal from said quadrature-phase synchronous detection response supplied thereto comprises an analog lowpass filter connected for supplying said local oscillator said automatic-frequency-and-phase-control signal in response to said quadrature-phase synchronous detection response.

3. An apparatus for practicing a method for extracting information from a vestigial sideband amplitude-modulation signal generated in accordance with a modulating signal, said method for extracting information from said vestigial sideband amplitude-modulation signal comprising the steps of:

mixing said vestigial sideband amplitude-modulation signal with a first beat frequency different from a carrier frequency of said vestigial sideband amplitude-modulation signal, said first beat frequency being of such value as to generate a first mixing result that is translated in frequency to have a carrier at an offset frequency;

mixing said vestigial sideband amplitude-modulation signal with a second beat frequency different from the carrier frequency of said vestigial sideband amplitude-modulation signal and from said first beat frequency, said second beat frequency being of such value as to generate a second mixing result that is translated in frequency to have a carrier at said offset frequency; and combining said first and second mixing results, which have respective frequency spectra that are images of each other, to form said double-sideband amplitude-modulation signal with its carrier frequency at said offset frequency;

for converting said vestigial sideband amplitude-modulation signal to said double-sideband amplitude-modulation signal containing similar information, and said method for extracting information from said vestigial sideband amplitude-modulation signal further comprising the step of detecting the information contained in said double-sideband amplitude-modulation signal, said apparatus comprising:

a local oscillator for generating local oscillations of a frequency and phase controlled by an automatic-frequency-and-phase-control signal;

a balanced modulator connected for amplitude-modulating said first local oscillations in accordance with said offset frequency, to generate a balanced modulator output signal essentially consisting of a first beat frequency component and a second beat frequency component;

a mixer connected for mixing said balanced modulator output signal with said vestigial sideband amplitude-modulation signal, to generate a mixer output signal including said double-sideband amplitude-modulation signal;

an image-rejection filter connected for supplying said double-sideband amplitude-modulation signal as a selective response to said mixer output signal;

an analog-to-digital converter for digitizing the selective response of said image-rejection filter to supply a digitized double-sideband amplitude-modulation signal;

a digital phase-splitter connected for generating a complex response to said digitized double-sideband amplitude-modulation signal;

a digital complex multiplier connected for multiplying said complex response to said digitized double-sideband amplitude-modulation signal by a complex digital carrier the frequency of which equals said offset frequency, to generate a digital in-phase synchronous detection response and a digital quadrature-phase synchronous detection response; and circuitry for generating said automatic-frequency-and-phase-control signal from said digital quadrature-phase synchronous detection response supplied thereto, which automatic-frequency-and-phase-control signal is applied to said local oscillator to complete an automatic-frequency-and-phase-control loop for adjusting the frequency and phase of the local oscillations generated by said local oscillator so that said digital in-phase synchronous detection response describes the modulating signal in accordance with which said vestigial sideband amplitude-modulation signal was generated.

4. The apparatus of claim 3, wherein said circuitry for generating said automatic-frequency-and-phase-control signal from said digital quadrature-phase synchronous detection response supplied thereto comprises:

a digital-to-analog converter connected for responding to said digital quadrature-phase synchronous detection response to supply a digital-to-analog converter response; and an analog lowpass filter connected for supplying said local oscillator said automatic-frequency-and-phase-control signal in response to said digital-to-analog converter response.

5. The apparatus of claim 3, further comprising:

read-only memory, for supplying said digital complex multiplier with said complex digital carrier to multiply said complex response to said digitized double-sideband amplitude-modulation signal by, and for supplying a digitized offset frequency signal.

6. An apparatus for practicing a method for extracting information from a vestigial sideband amplitude-modulation signal generated in accordance with a modulating signal, said method for extracting information from said vestigial sideband amplitude-modulation signal comprising the steps of:

mixing said vestigial sideband amplitude-modulation signal with a first beat frequency different from a carrier frequency of said vestigial sideband amplitude-modulation signal, said first beat frequency being of such value as to generate a first mixing result that is translated in frequency to have a carrier at an offset frequency;

mixing said vestigial sideband amplitude-modulation signal with a second beat frequency different from the carrier frequency of said vestigial sideband amplitude-modulation signal and from said first beat frequency, said second beat frequency being of such value as to generate a second mixing result that is translated in frequency to have a carrier at said offset frequency; and combining said first and second mixing results, which have respective frequency spectra that are images of each other, to form said double-sideband amplitude-modulation signal with its carrier frequency at said offset frequency;

for converting said vestigial sideband amplitude-modulation signal to said double-sideband amplitude-modulation signal containing similar information, and said method for extracting information from said vestigial sideband amplitude-modulation signal further comprising the step of detecting the information contained in said double-sideband amplitude-modulation signal, said apparatus comprising:

a complex multiplier for multiplying a complex double-sideband amplitude-modulation signal by a complex carrier the frequency of which equals said offset frequency, to generate an in-phase synchronous detection response and a quadrature-phase synchronous detection response;

a local oscillator for generating orthogonal first and second phases of local oscillations, the frequency and phases of which are controlled by an automatic-frequency-and-phase-control signal;

a first balanced modulator connected for amplitude-modulating said first phase of local oscillations in accordance with said offset frequency, to generate a first balanced modulator output signal essentially consisting of a first beat frequency component and a second beat frequency component;

a first mixer connected for mixing said first balanced modulator output signal with said vestigial sideband amplitude-modulation signal, to generate a first mixer output signal including a real component of said complex double-sideband amplitude-modulation signal;

a first image-rejection filter connected for supplying to said digital complex multiplier said real component of said complex double-sideband amplitude-modulation signal as a selective response to said first mixer output signal;

a second balanced modulator connected for amplitude-modulating said second phase of local oscillations in accordance with said offset frequency, to generate a second balanced modulator output signal essentially consisting of a third beat frequency component and a fourth beat frequency component, said first and third beat frequency components being the same in frequency but orthogonal in phase, and said second and fourth beat frequency components being the same in frequency but orthogonal in phase;

a second mixer connected for mixing said second balanced modulator output signal with said vestigial sideband amplitude-modulation signal, to generate a second mixer output signal including an imaginary component of said complex double-sideband amplitude-modulation signal;

a second image-rejection filter connected for supplying to said digital complex multiplier said imaginary component of said complex double-sideband amplitude-modulation signal as a selective response to said second mixer output signal; and circuitry for generating said automatic-frequency-and-phase-control signal from said quadrature-phase synchronous detection response, which circuitry completes an automatic-frequency-and-phase-control loop adjusting the frequency and phase of the local oscillations generated by said local oscillator so that said in-phase synchronous detection response reproduces the modulating signal in accordance with which said vestigial sideband amplitude-modulation signal was generated.

7. The apparatus of claim 6, wherein said circuitry for generating said automatic-frequency-and-phase-control signal from said quadrature-phase synchronous detection response supplied thereto comprises an analog lowpass filter connected for supplying said local oscillator said automatic-frequency-and-phase-control signal in response to said quadrature-phase synchronous detection response.

8. An apparatus for practicing a method for extracting information from a vestigial sideband amplitude-modulation signal generated in accordance with a modulating signal, said method for extracting information from said vestigial sideband amplitude-modulation signal comprising the steps of:

mixing said vestigial sideband amplitude-modulation signal with a first beat frequency different from a carrier frequency of said vestigial sideband amplitude-modulation signal, said first beat frequency being of such value as to generate a first mixing result that is translated in frequency to have a carrier at an offset frequency;

mixing said vestigial sideband amplitude-modulation signal with a second beat frequency different from the carrier frequency of said vestigial sideband amplitude-modulation signal and from said first beat frequency, said second beat frequency being of such value as to generate a second mixing result that is translated in frequency to have a carrier at said offset frequency; and combining said first and second mixing results, which have respective frequency spectra that are images of each other, to form said double-sideband amplitude-modulation signal with its carrier frequency at said offset frequency;

for converting said vestigial sideband amplitude-modulation signal to said double-sideband amplitude-modulation signal containing similar information, and said method for extracting information from said vestigial sideband amplitude-modulation signal further comprising the step of detecting the information contained in said double-sideband amplitude-modulation signal, said apparatus comprising:

a digital complex multiplier connected for multiplying a complex digitized double-sideband amplitude-modulation signal by a complex digital carrier, the frequency of which equals said offset frequency, to generate a digital in-phase synchronous detection response and a digital quadrature-phase synchronous detection response;

a local oscillator for generating orthogonal first and second phases of local oscillations, the frequency and phases of which are controlled by an automatic-frequency-and-phase-control signal;

a first balanced modulator connected for amplitude-modulating said first phase of local oscillations in accordance with said offset frequency, to generate a first balanced modulator output signal essentially consisting of a first beat frequency component and a second beat frequency component;

a first mixer connected for mixing said first balanced modulator output signal with said vestigial sideband amplitude-modulation signal, to generate a first mixer output signal;

a first image-rejection filter connected for supplying a real double-sideband amplitude-modulation signal as a selective response to said first mixer output signal;

a first analog-to-digital converter connected for digitizing the real double-sideband amplitude-modulation signal said first image-rejection filter supplies as a selective response to said first mixer output signal, said first analog-to-digital converter connected for supplying the digitized real double-sideband amplitude-modulation signal to said digital complex multiplier as a component of said complex digitized double-sideband amplitude-modulation signal said digital complex multiplier multiplies by said complex digital carrier;

a second balanced modulator connected for amplitude-modulating said second phase of local oscillations in accordance with said offset frequency, to generate a second balanced modulator output signal essentially consisting of a third beat frequency component and a fourth beat frequency component, said first and third beat frequency components being the same in frequency but orthogonal in phase, and said second and fourth beat frequency components being the same in frequency but orthogonal in phase;

a second mixer connected for mixing said second balanced modulator output signal with said vestigial sideband amplitude-modulation signal, to generate a second mixer output signal;

a second image-rejection filter connected for supplying an imaginary double-sideband amplitude-modulation signal as a selective response to said second mixer output signal;

a second analog-to-digital converter connected for digitizing the imaginary double-sideband amplitude-modulation signal said second image-rejection filter supplies as a selective response to said second mixer output signal, said second analog-to-digital converter connected for supplying the digitized imaginary double-sideband amplitude-modulation signal to said digital complex multiplier as a component of said complex digitized double-sideband amplitude-modulation signal said digital complex multiplier multiplies by said complex digital carrier; and circuitry for generating said automatic-frequency-and-phase-control signal from said quadrature-phase synchronous detection response, which circuitry completes an automatic-frequency-and-phase-control loop adjusting the frequency and phase of the local oscillations generated by said local oscillator so that said in-phase synchronous detection response reproduces the modulating signal in accordance with which said vestigial sideband amplitude-modulation signal was generated.

9. The apparatus of claim 8, wherein said circuitry for generating said automatic-frequency-and-phase-control signal from said digital quadrature-phase synchronous detection response supplied thereto comprises:

a digital-to-analog converter connected for responding to said digital quadrature-phase synchronous detection response to supply a digital-to-analog converter response; and an analog lowpass filter connected for supplying said local oscillator said automatic-frequency-and-phase-control signal in response to said digital-to-analog converter response.

* * * * *